United States Patent
Chang et al.

(10) Patent No.: US 12,074,122 B2
(45) Date of Patent: *Aug. 27, 2024

(54) INDUCTOR STRUCTURE, SEMICONDUCTOR PACKAGE AND FABRICATION METHOD THEREOF

(71) Applicant: Taiwan Semiconductor Manufacturing Company, Ltd., Hsinchu (TW)

(72) Inventors: Chih-Yuan Chang, Hsinchu (TW); Jiun-Yi Wu, Taoyuan (TW); Chien-Hsun Lee, Hsin-chu County (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,246

(22) Filed: Apr. 16, 2023

(65) Prior Publication Data
US 2023/0253348 A1 Aug. 10, 2023

Related U.S. Application Data

(63) Continuation of application No. 17/218,059, filed on Mar. 30, 2021, now Pat. No. 11,658,134.

(51) Int. Cl.
*H01L 23/48* (2006.01)
*H01L 21/48* (2006.01)
(Continued)

(52) U.S. Cl.
CPC ........ *H01L 23/645* (2013.01); *H01L 21/4857* (2013.01); *H01L 23/145* (2013.01); *H01L 23/49822* (2013.01); *H01L 23/49838* (2013.01); *H01L 24/16* (2013.01); *H01L 28/10* (2013.01); *H01L 28/40* (2013.01); *H03H 7/0115* (2013.01); *H01L 2224/16227* (2013.01); *H01L 2924/19041* (2013.01); *H01L 2924/19042* (2013.01); *H01L 2924/19103* (2013.01)

(58) Field of Classification Search
CPC H01L 23/49822; H01L 23/645; H01L 23/145
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Nicholas J Tobergte
(74) *Attorney, Agent, or Firm* — JCIPRNET

(57) ABSTRACT

A structure includes a first via and a first conductive line embedded in a first dielectric layer and spaced apart from each other by the first dielectric layer. A first metal pattern disposed on the first via and embedded in a second dielectric layer. A first conductive via disposed on the first conductive line and embedded in the second dielectric layer. The first metal pattern and the first conductive via are spaced apart from each other and are located on a first horizontal level, and the first metal pattern has an open ring shape. A second via disposed on the first metal pattern and embedded in a third dielectric layer. An inductor structure including the first via, the first metal pattern, and the second via.

16 Claims, 27 Drawing Sheets

(51) Int. Cl.
*H01L 23/00* (2006.01)
*H01L 23/14* (2006.01)
*H01L 23/498* (2006.01)
*H01L 23/64* (2006.01)
*H01L 49/02* (2006.01)
*H03H 7/01* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,658,134 B2 * | 5/2023 | Chang ................ H01L 23/5383 257/531 |
| 2019/0014655 A1 * | 1/2019 | Yazaki ................... H05K 1/181 |
| 2019/0393168 A1 * | 12/2019 | Park ....................... H01L 23/562 |
| 2021/0099149 A1 * | 4/2021 | Lan ....................... H03H 7/1741 |
| 2022/0165679 A1 * | 5/2022 | Chen ................. H01L 23/49838 |
| 2022/0173055 A1 * | 6/2022 | Ting ..................... H01L 23/645 |

\* cited by examiner

INDUCTOR STRUCTURE, SEMICONDUCTOR PACKAGE AND FABRICATION METHOD THEREOF

CROSS-REFERENCE TO RELATED APPLICATION

This is a continuation application of and claims the priority benefit of a prior application Ser. No. 17/218,059, filed on Mar. 30, 2021, now allowed. The entirety of the above-mentioned patent application is hereby incorporated by reference herein and made a part of this specification.

BACKGROUND

The increasing integration density of a variety of semiconductor devices and electronic components leads to the demand for compact packaging technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
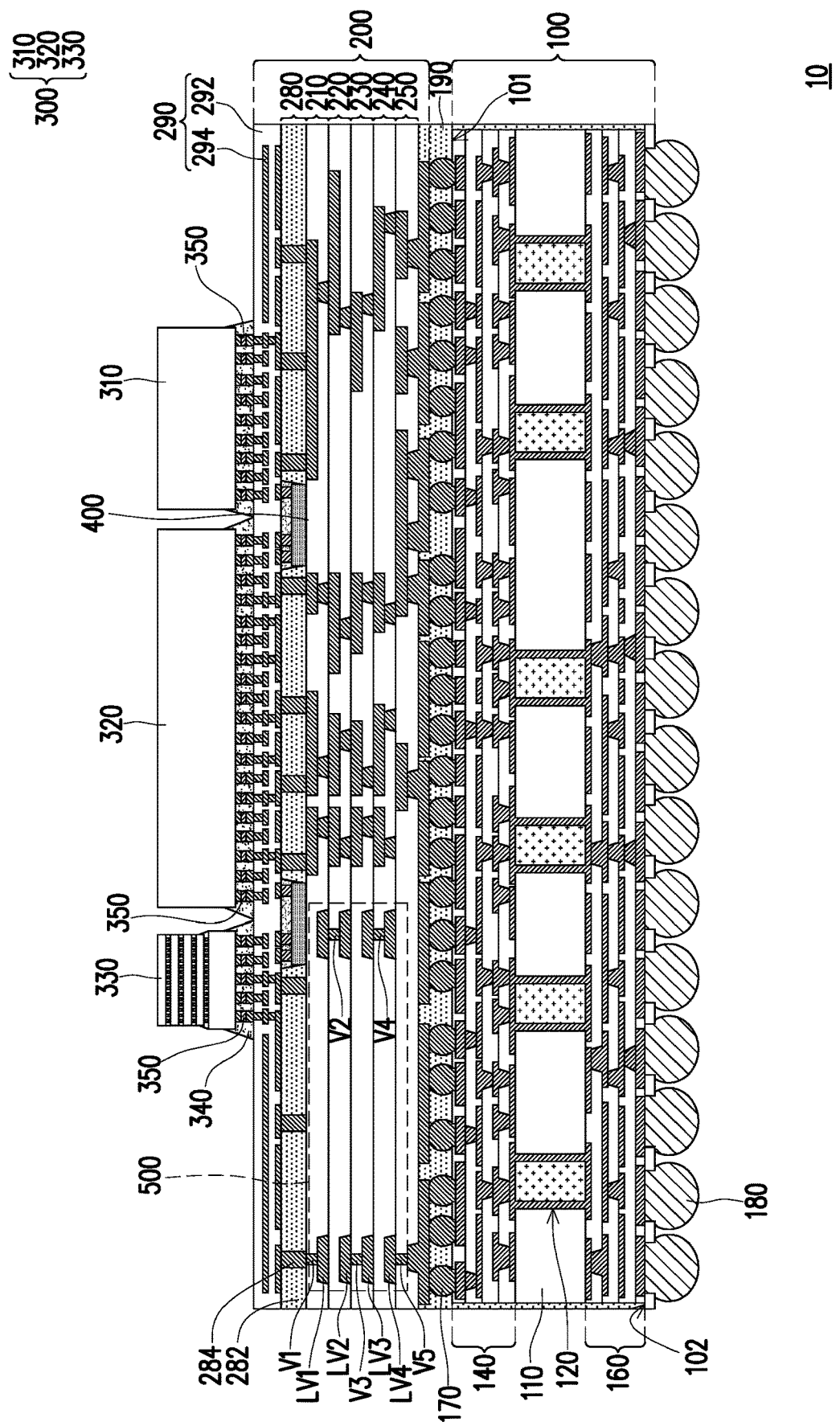
FIG. 1 illustrates a cross-sectional view of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a semiconductor package is having one or more integrated circuit dies. In some embodiments, the semiconductor package is a system-on-integrated-substrate (SoIS) package. The semiconductor package includes an integrated component embedded in an interconnect layer of a redistribution structure. The embedded integrated component includes interconnecting layers and capacitors to provide electrical connection between the integrated circuit dies and charge storing capacitor functions. With the capacitor(s) having large capacitance, the embedded integrated component increases the communication bandwidth between the integrated circuit dies while maintaining low contact resistance and high reliability. The semiconductor package further includes an inductor embedded in the redistribution layers of the redistribution structure. An LC filter is a low pass filter built with an inductor and capacitor(s). The embedded inductor in the redistribution structure and the capacitors of the embedded integrate component form an efficient LC circuit to increase power efficiency of the semiconductor package. The embedded inductor and the integrated component are also integrated into the redistribution structure, so as to reduce the length of the signal path between the LC circuit and the integrated circuit dies. In embodiments, the inductor has low parasitic impedance and high inductance, and the inductor may provide larger current drawn for high power voltage regulator of the semiconductor package. In embodiments, for the inductor having a magnetic core, a higher inductance is provided and the semiconductor package has higher power efficiency.

The redistribution structure is connected to the integrated circuit dies and provides electrical connection between the integrated circuit dies and an organic substrate and/or between the integrated circuit dies. The organic substrate is additionally connected to a set of external conductive features, such as printed circuit board (PCB), but not limited thereto. In such a manner, the integrated circuit dies are electrically connected to the organic substrate, and further to the external conductive features, through the organic substrate and the redistribution structure.

In accordance with some embodiments, the embedded integrated component(s) is integrated in the redistribution structure and integrated with the organic substrate and the integrated circuit dies, and the semiconductor package is compact in size.

In accordance with some embodiments, conductive connectors used to connect the organic substrate to the redistribution structures may take the form of, for example, a ball grid array (BGA). Integration of such conductive connectors may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

FIG. 1 illustrates a cross-sectional view of a semiconductor package in accordance with some embodiments of the present disclosure. In some embodiments, the semiconductor package 10 includes an organic substrate 100, conductive connectors 180 disposed on the bottom side 102 of the organic substrate 100, and a multilayered structure 200 disposed on the top side 101 of the organic substrate 100 and connected with the organic substrate 100 through conductive connectors 170. In some embodiments, the semiconductor package 10 includes semiconductor dies or integrated circuit dies 300 disposed on and electrically connected with the multilayered structure 200. The integrated circuit dies 300 may include one or more types of semiconductor dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, a hybrid memory cube (HMC), a high bandwidth memory (HBM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. As shown in FIG. 1, the integrated circuit dies 300 includes at least a first die 310, a second die 320 and a third die 330. In some embodiments, the first, second and third dies 310, 320, 330 are different types of dies or have different functionalities. In some embodiments, the first die 310 includes a logic die, the second die 320 includes a power management die and the third die 330 includes a memory die.

In some embodiments, the first die 310, the second die 320, and the third die 330 are bonded to the multilayered structure 200 through connectors 350. For example, the connectors 350 may include bumps, micro-bumps, copper posts or copper posts with solders, and the materials of the connectors 350 include copper, titanium, tungsten, cobalt, nickel, tin, aluminum, silver, gold, or the like, but not limited thereto. Through the connectors 350, electrical connection between the integrated circuit dies 300 and the multilayered structure 200 and/or the organic substrate 100 are achieved. In some embodiments, an underfill 340 may be formed between the integrated circuit dies 300 and the multilayered structure 200 to secure the bonding of the integrated circuit dies 300 to the multilayered structure 200 and provide structural support and protection.

As discussed in greater detail below, the multilayered structure 200 provides electrical pathing and connection between the integrated circuit dies 300 and the organic substrate 100 by way of conductive bumps 170. In some embodiments, the multilayered structure 200 includes a molded layer 280, an upper redistribution layer 290 and lower redistribution layers 210-250. In some embodiments, the upper redistribution layer 290 facilitates the electrical pathing and connection between the integrated circuit dies 300 and the molded layer 280.

As seen in FIG. 1, the molded layer 280 of the multilayered structure 200 includes integrated components 400. In some embodiments, some of the integrated components 400 include interconnecting layers (not illustrated) and functioning as a bridge component to provide electrical routing and connection between some or all of the integrated circuit dies 300. In some embodiments, at least one of the integrated components 400 includes integrated passive devices such as capacitors or deep trench capacitors. In some embodiments, the integrated component 400 may be referred to as an interconnecting die with integrally formed capacitors, and the integrated components 400 can increase the communication bandwidth between the first die 310, the second die 320, and the third die 330 while maintaining low contact resistance and high reliability. For example, the deep trench capacitors in the integrated component 400 may be formed of hafnium (Hf)-based materials, and the deep trench capacitor may have a permittivity of larger than $5_{\varepsilon_0}$, but not limited thereto. As illustrated in FIG. 1, the integrated components 400 are embedded in the molded layer 280, and the integrated components 400 are connected to metallization patterns 294 of the redistribution layer 290. In some embodiments, some integrated components 400 are electrically connected to the integrated circuit dies 300 through the redistribution layer 290 and the conductive connectors 350. In some embodiments, some integrated components 400 are electrically connected to the multilayered structure 200 through the redistribution layer 290 and the conductive vias 284 in the molded layer 280. In some embodiments, the integrated components 400 are considered to be embedded within the multilayered structure 200.

Referring to FIG. 1, the multilayered structure 200 is disposed on a first side 101 of the organic substrate 100. In some embodiments, the organic substrate 100 includes an organic core 110, with through vias 120 extending through the organic core 110 and redistribution structures 140, 160 disposed on opposing sides of the organic core 110. Generally, the organic substrate 100 provides structural support for the package, as well as providing electrical signal routing between the integrated circuit dies 300 and the laminate circuits such as printed circuit board (PCB) or other subpackages, but not limited thereto. An encapsulant 190 may be optionally disposed between the multilayered structure 200 and the organic substrate 100 to secure the bonding of the conductive connectors 170 and provide structural support and environmental protection. In some embodiments, the encapsulant 190 fills the gaps between the conductive connectors 170 and covers side surfaces of the organic substrate 100.

FIG. 2 through FIG. 9 illustrate cross-sectional views of intermediate steps during a process for fabricating a semiconductor package in accordance with some embodiments. The illustrations of the individual features have been simplified in FIG. 2 through FIG. 9 for ease of illustration. Please first refer to FIG. 1 and FIG. 2 through FIG. 7 for the following descriptions on the fabrication of the multilayered structure 200.

Figure 2:
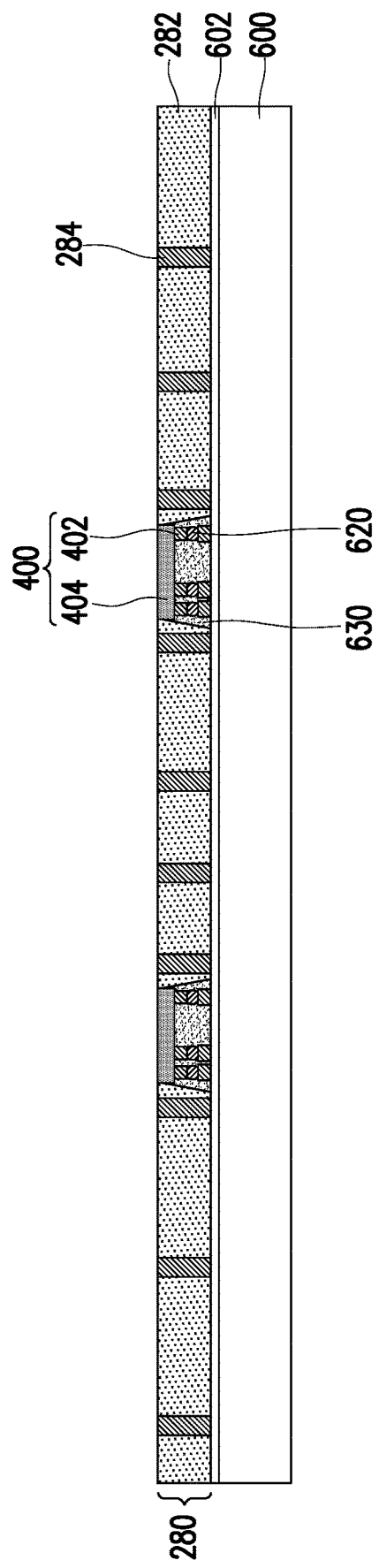
FIG. 2 through FIG. 9 illustrate cross-sectional views of intermediate steps during a process for fabricating a semiconductor package in accordance with some embodiments.

Referring to FIG. 2, a carrier substrate 600 is provided, a release layer 602 is formed on the carrier substrate 600. The carrier substrate 600 may be a glass carrier substrate, a ceramic carrier substrate, or the like, but not limited thereto. In some embodiments, the carrier substrate 600 is a wafer. The release layer 602 may be formed of a polymer-based material, which may be removed along with the carrier substrate 600 from the overlying structures that will be formed in subsequent steps. In some embodiments, the release layer 602 is an epoxy-based thermal-release material, which loses its adhesive property when heated, such as a light-to-heat-conversion (LTHC) release coating. In other embodiments, the release layer 602 may be an ultra-violet (UV) glue, which loses its adhesive property when exposed to UV lights. The release layer 602 may be dispensed as a liquid and cured, may be a laminate film laminated onto the carrier substrate 600, or may be the like, but not limited thereto. The top surface of the release layer 602 may be leveled and be planar within process variations.

The molded layer 280 includes conductive vias 284 and molding material 282. The conductive vias 284 are formed over the release layer 602. The conductive vias 284 are through dielectric vias being disposed adjacent to the subsequently attached integrated components 400. In some other embodiment, the conductive vias 284 are also referred to as through insulator via (TIV).

The integrated components 400 is disposed on the release layer 602. The integrated components 400 may be processed according to applicable manufacturing processes to form dies. For example, the integrated components 400 includes a substrate 404, such as silicon, doped or undoped, or an active layer of a semiconductor-on-insulator (SOI) substrate. The substrate 404 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 404 may be made of a ceramic material, a polymer material, a magnetic material, or a combination thereof. Other substrates, such as multi-layered or gradient substrates, may also be used. The substrate 404 has an active surface (e.g., the surface facing downwards in FIG. 2), sometimes called a front side, and an inactive surface (e.g., the surface facing upwards in FIG. 2), sometimes called a back side.

In some embodiments, the integrated components 400 may include active or passive devices embedded in the substrate 404. In some embodiments, the integrated components 400 may be free of active or passive devices and may only be used for routing of electrical signals. Active devices may include transistors, diodes, or the likes. Passive devices may include capacitors, resistors, inductors, etc., but not limited thereto. In some embodiments, the integrated component 400 include the interconnecting layers electrically connecting to the capacitors.

The integrated components 400 further includes die connectors 402, such as conductive pillars. The die connectors 402 may be formed by, for example, plating, or the like. The die connectors 402 are disposed on the release layer 602.

Referring to FIG. 2, underfill 630 is formed between the integrated components 400 and the release layer 602. In some embodiments, the underfill 630 extends up along sidewalls of the integrated components 400. The underfill 630 may reduce stress and protect the die connectors 402 and the solder connections 620. The underfill 630 may be formed by a capillary flow process after the integrated components 400 are attached, or may be formed by a suitable deposition method.

A molding material 282 is formed on and around the conductive vias 284, the underfill 630, and the integrated components 400. The molding material 282 encapsulates the integrated components 400 and the conductive vias 284. In some embodiments, the molding material 282 may include pre-preg, Ajinomoto Build-up Film (ABF), resin coated copper (RCC), molding compound, polyimide, photo-imageable dielectric (PID), epoxy, or the like, but not limited thereto. In some embodiments, the molding material 282 may include other materials, such as silicon oxide, silicon nitride, or the like. The molding material 282 may be applied by compression molding, transfer molding, or the like.

A planarization process is optionally performed on the molding material 282. Portions of the molding material 282 and the conductive vias 284 are removed. Topmost surfaces of the molding material 282, the conductive vias 284, and the backside of the integrated components 400 are substantially levelled (e.g., planar) within process variations after the planarization process. The planarization process may be, for example, a chemical-mechanical polish (CMP).

Figure 3:
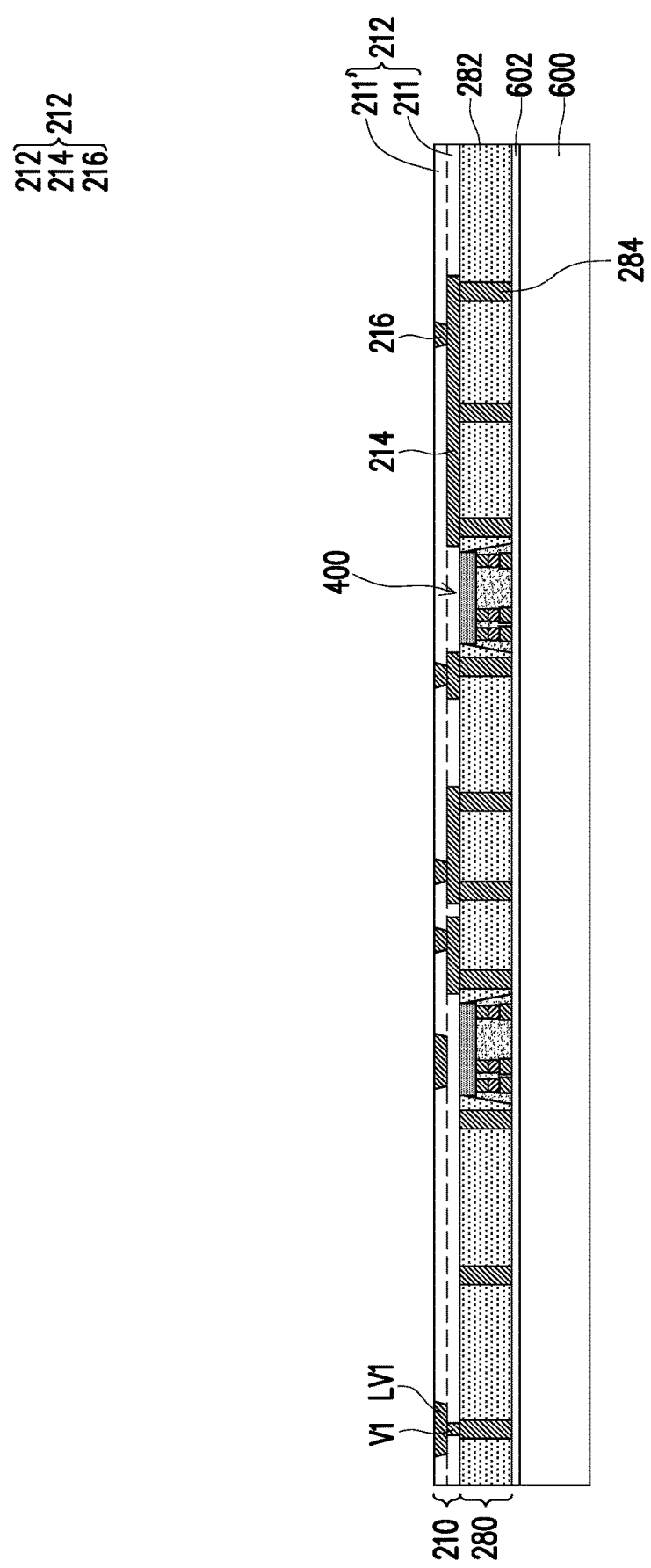

Referring to FIG. 3, a dielectric layer 211 (e.g. a first dielectric layer) is formed on the molded layer 280, the integrated components 400, and the conductive vias 284. Conductive lines 214 (e.g., first conductive lines) and a first via V1 of an embedded inductor 500, which is shown in FIG. 1, are formed on the molder layer 280 and the conductive vias 284. The conductive lines 214 and the first via V1 are embedded in the dielectric layer 211. In some embodiments, the first via V1 electrically connects the conductive vias 284, so as to electrically connect the inductor 500 to the molded layer 280.

As an example of the formation of the conductive lines 214 and the first via V1, a photoresist pattern (not shown) is formed over the dielectric layer 211 with openings exposing the dielectric layer 211. The dielectric layer 211 is then patterned to form openings corresponding to the locations of the conductive lines 214 and the first via V1. In some embodiments, the dielectric layer 211 is patterned through etching processes such as a reactive ion etch (RIE) or the like. The photoresist pattern is then removed by a stripping process, exposing the dielectric layer 211. A seed layer (not shown) is formed over the dielectric layer 211, the integrated components 400, and the conductive vias 284. In some embodiments, the seed layer is a metal layer, which may be a single layer or a composite layer comprising a plurality of sub-layers formed of different materials. The seed layer may be, for example, a composite layer of a titanium layer and a copper layer over the titanium layer. The seed layer may be formed using, for example, physical vapor deposition (PVD) or the like. A conductive material is then formed in the openings of the dielectric layer 211 and on the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 214 and the first via V1. Portions of the dielectric layer 211, the seed layer and the conductive material are removed in a planarization process, such as CMP. After the planarization process, the top surfaces of the dielectric layer 211, the conductive lines 214 and the first via V1 are substantially levelled within process variations. In some embodiments, the conductive lines 214 and the first via V1 are located on substantially the same horizontal level as they are formed on the same horizontal plane by the same formation process. Under the above configurations, the conductive lines 214 of the first redistribution layer 210 and the first via V1 of the inductor 500 may be formed in a same formation process, so as to simplify the manufacturing process and to save cost.

In some embodiments, the dielectric layer 211 includes a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like, or a combination thereof, but not limited thereto. The dielectric layer 211 may be formed, for example, by spin coating, lamination, chemical vapor deposition (CVD), or the like.

Figure 4:
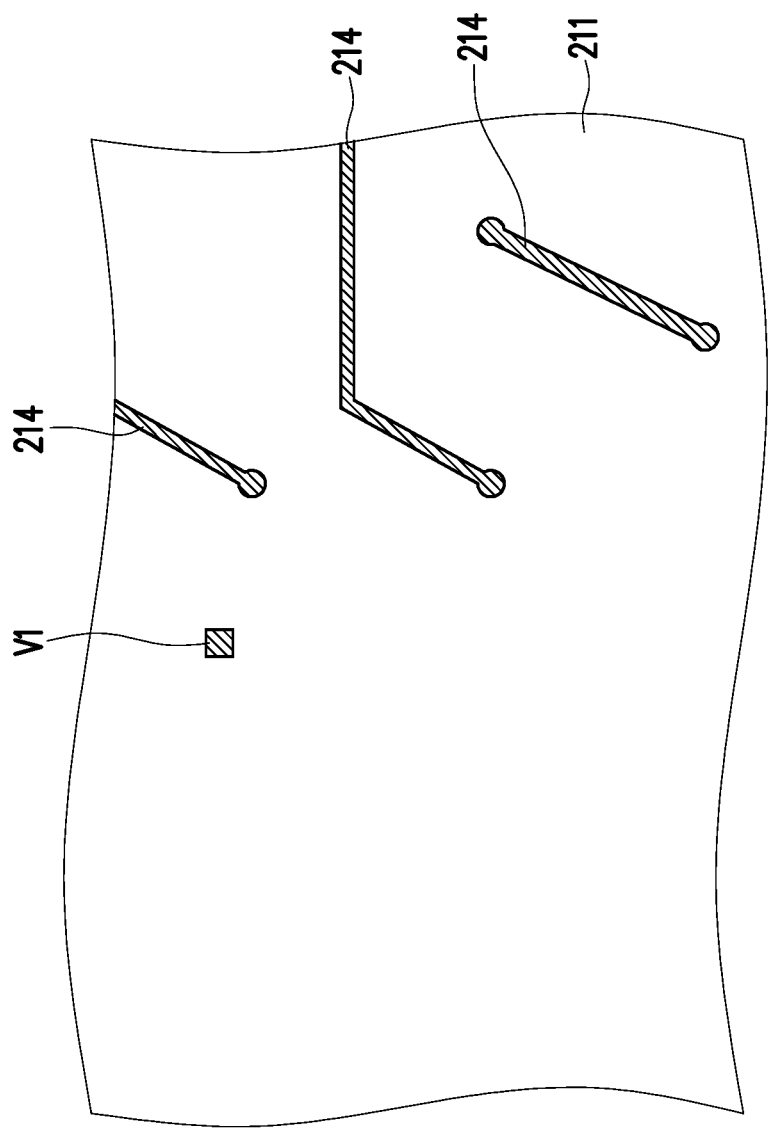

FIG. 4 illustrates a planar view of the conductive lines and the first via. The conductive lines 214 and the first via V1 are embedded in the dielectric layer 211. The conductive lines 214 are used for electrical pathing. The first via V1 of the inductor 500 is used to connect the inductor 500 to the conductive via 284.

Referring to FIG. 3 again, a dielectric layer 211' (e.g. a second dielectric layer) is formed on the dielectric layer 211, the conductive lines 214 and the first via V1. The dielectric layer 211' may be similar to the dielectric layer 211 described above and the description is not repeated herein. Conductive vias 216 (e.g. first conductive vias) and the first metal pattern LV1 of the embedded inductor 500 are formed on the dielectric layer 211 and over the molded layer 280 (including the embedded integrated components 400). The conductive vias 216 and the first metal pattern LV1 are embedded in the dielectric layer 211'. The first metal pattern LV1 is disposed on the first via V1. The conductive vias 216 are disposed on the conductive lines 214. In some embodiments, a thickness of the dielectric layer 211' is larger than a thickness of the dielectric layer 211. For example, the thickness of the dielectric layer 211' may be up to five times the thickness of the dielectric layer 211, but not limited thereto. In some embodiments, the conductive vias 216 and the first metal pattern LV1 embedded in the dielectric layer 211' have a thickness larger than the thickness of the conductive lines 214 and the first via V1 embedded in the dielectric layer 211, but not limited thereto.

As an example of the formation of the conductive vias 216 and the first metal pattern LV1, a photoresist pattern (not shown) is formed over the dielectric layer 211' with openings exposing the dielectric layer 211'. The dielectric layer 211' is then patterned to form openings and a trench corresponding to the locations of the conductive vias 216 and the first metal pattern LV1. In some embodiments, the dielectric layer 211' is patterned through etching processes such as a reactive ion etch (RIE) or the like. The photoresist pattern is then removed by a stripping process, exposing the dielectric layer 211'. A seed layer (not shown) is formed over the dielectric layer 211', the conductive lines 214, the first via V1, and the trench. A conductive material is then formed in the openings and the trench of the dielectric layer 211' and on the seed layer. The conductive material may be formed by plating. The conductive material may comprise a metal, like copper, titanium, tungsten, aluminum, or the like. The combination of the conductive material and underlying portions of the seed layer form the conductive vias 216 and the first metal pattern LV1. Portions of the dielectric layer 211', the seed layer and the conductive material are removed in a planarization process, such as CMP. After the planarization process, the top surfaces of the dielectric layer 211', the conductive vias 216 and the first metal pattern LV1 are substantially horizontally leveled. In some embodiments, the conductive vias 216 and the first metal pattern LV1 of the first redistribution layer 210 are located on substantially the same horizontal level (e.g. a first horizontal level) as they are formed on the same horizontal plane by the same formation process. Under the above configurations, the conductive vias 216 of the first redistribution layer 210 and the first metal pattern LV1 of the inductor 500 are formed in the same forming process, so as to simplify the manufacturing process and to save cost.

Figure 5:
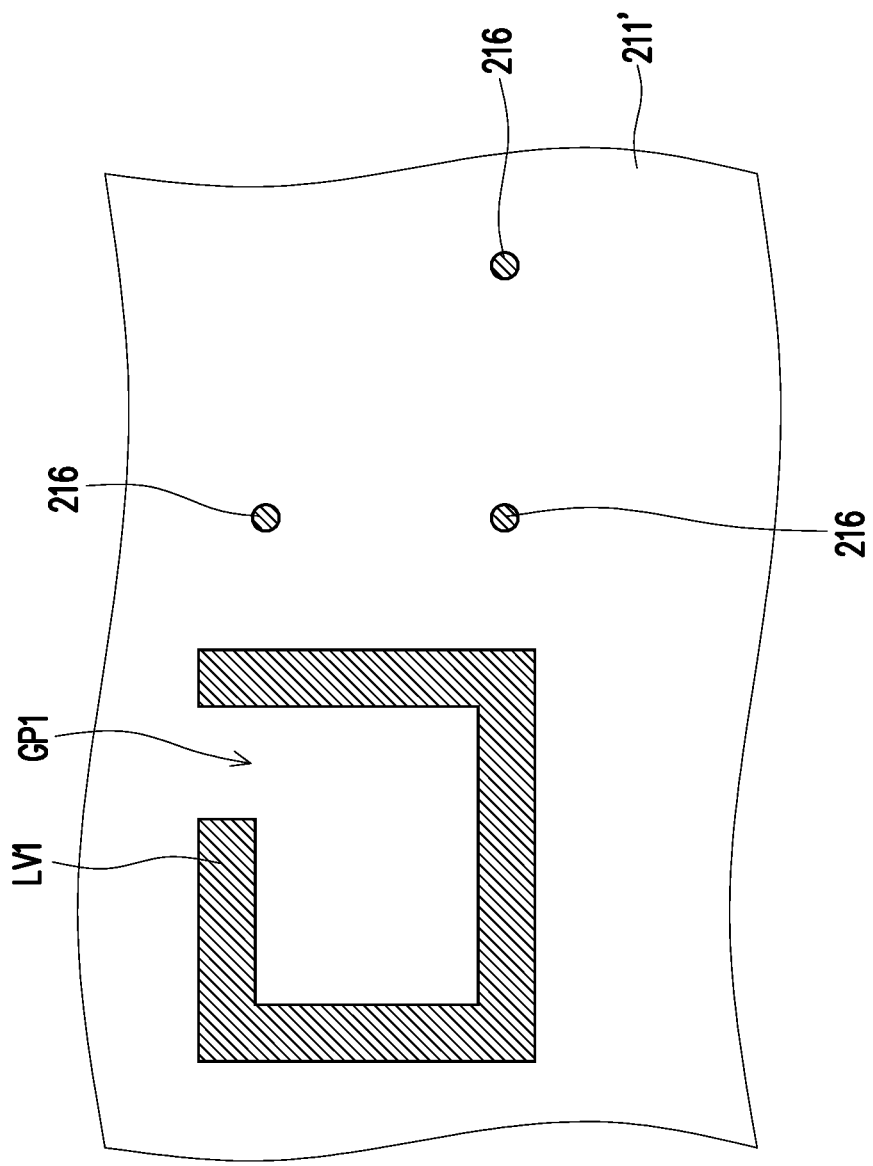

FIG. 5 illustrates a planar view of the conductive vias and the first metal pattern. The conductive vias 216 and the first metal pattern LV1 are embedded in the dielectric layer 211'. The first metal pattern LV1 has an open ring shape. For example, two opposite terminals of the first metal pattern LV1 are not joined and are separated by a gap GP1. The conductive vias 216 are used for interlayer connections. The first metal pattern V1 of the inductor 500 serves as a single turn or loop of a coil.

Referring to FIG. 3, FIG. 4, and FIG. 5, the first via V1 is located directly below the first metal pattern LV1 and the first via V1 is in direct contact with the first metal pattern LV1. For example, an orthographic projection of the first via V1 on the molded layer 280 is located within an orthographic projection of the first metal pattern LV1 on the molded layer 280. In some embodiments, an outer edge of the first via V1 and an outer edge of the first metal pattern LV1 are laterally spaced apart, therefore the outer edges of the first via V1 and the first metal pattern LV1 are not aligned, but not limited thereto.

In some embodiments, the stacked dielectric layer 211 and the dielectric layer 211' may be considered as a same dielectric layer and referred to as the dielectric layer 212 of the first redistribution layer 210. The conductive lines 214 and the conductive vias 216 are part of metallization patterns embedded in the dielectric layer 212. In some embodiments, the first via V1 and the first metal pattern LV1 are part of the metallization patterns, and the dielectric layer 212 together with the metallization patterns form the first redistribution layer 210. Under the above configurations, the first via V1 and the first metal pattern LV1, part of the inductor 500, are part of the metallization patterns embedded in the first redistribution layer 210.

Figure 6:
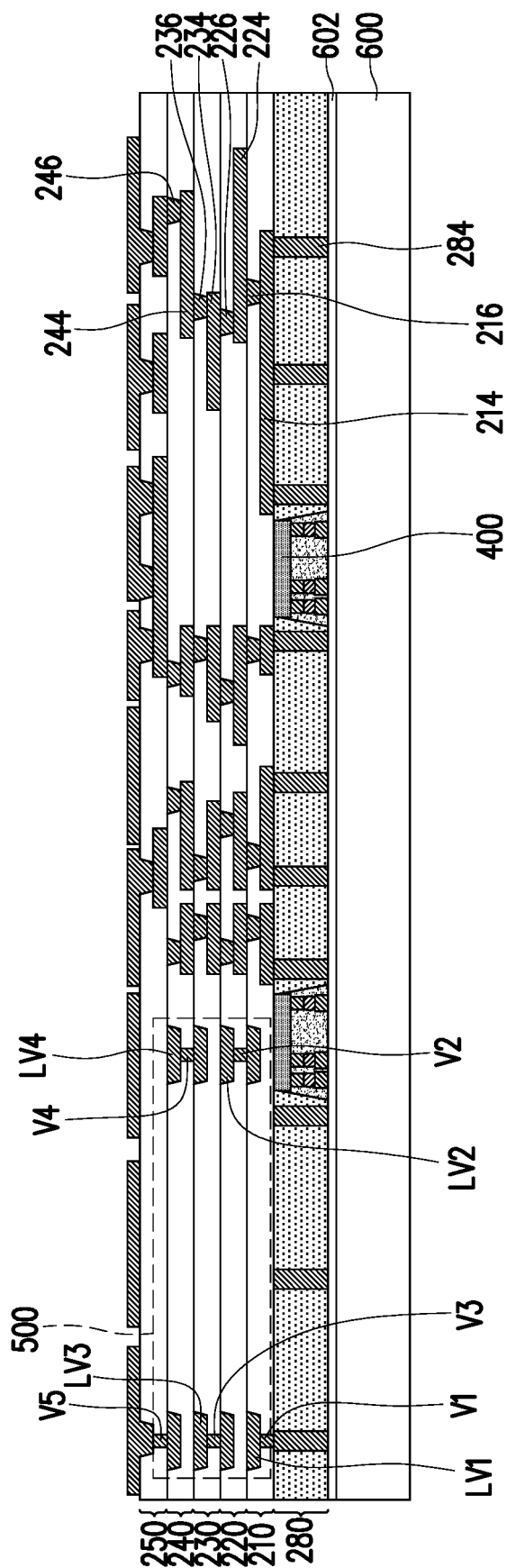
Figure 7:
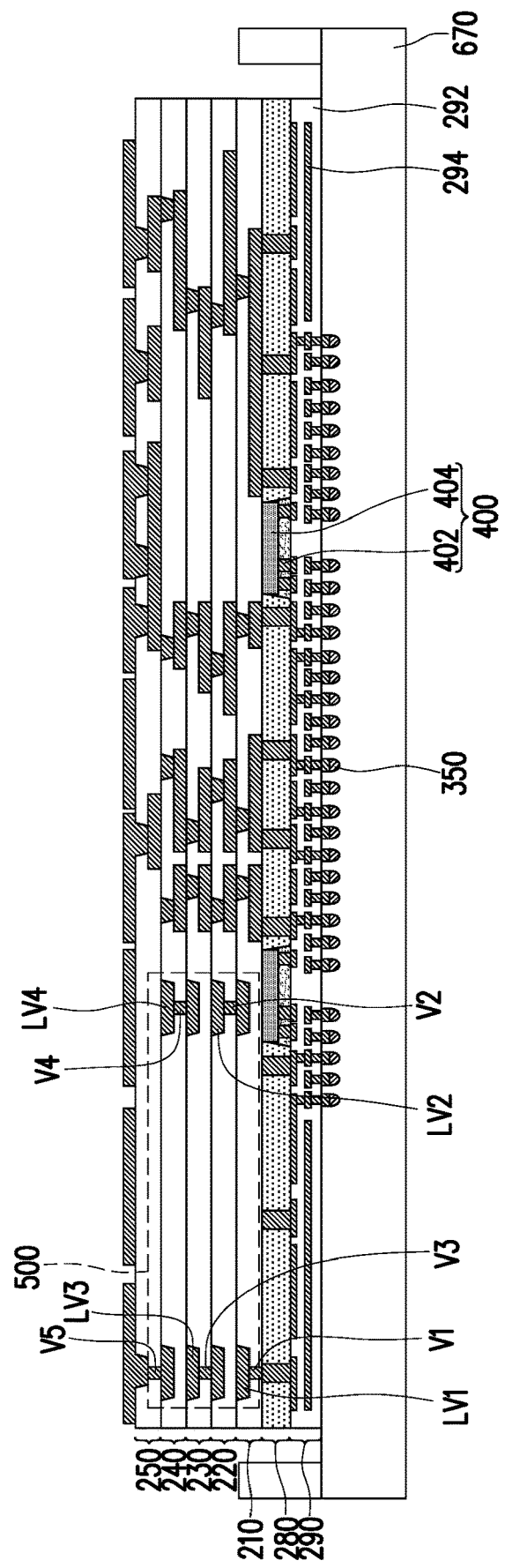
Figure 8:
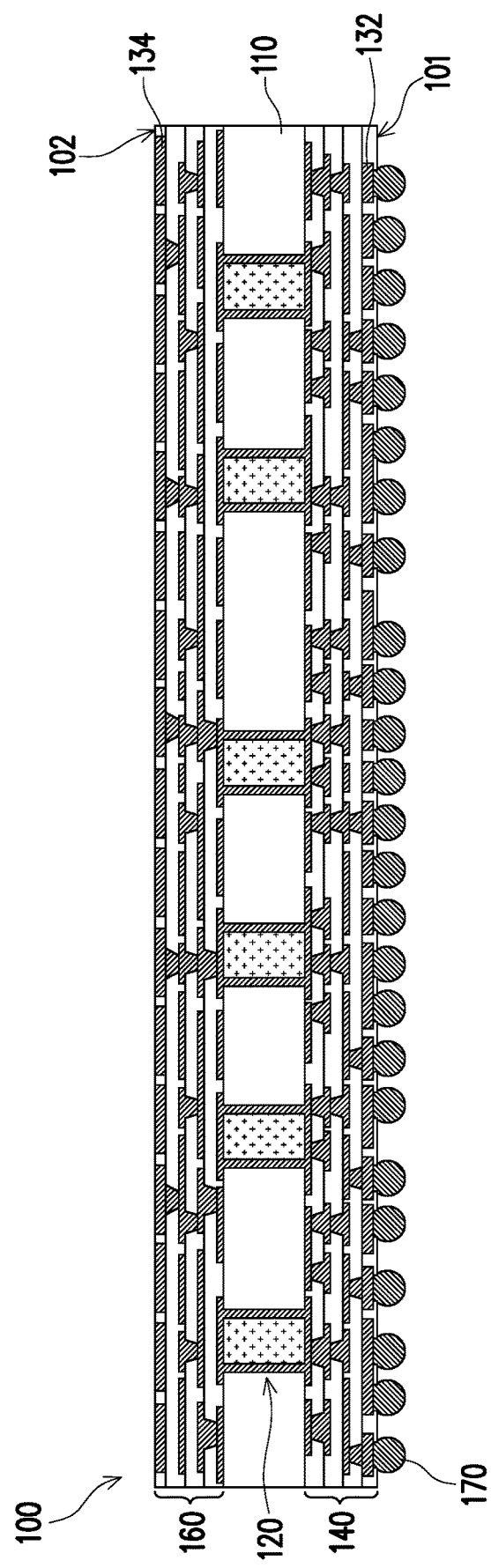

Referring to FIG. 6 to FIG. 8, the steps and process discussed above to form the first redistribution layer 210 are repeated to form additionally shown the lower redistribution layers 210, 220, 230, 240, and 250. In some embodiments, the process described above to form the first redistribution layer 210 may be repeated one or more times to provide additional routing layers as desired for a particular design. In FIG. 1, six redistribution layers 210, 220, 230, 240, 250, and 290 are shown for illustrative purposes, but the numbers of the redistribution layers in the multilayered structure 200 are not limited thereto. In some embodiments more or less than six layers may be used. The metallization patterns for each redistribution layer 210, 220, 230, 240, 250, and 290 may have separately formed conductive lines and conductive vias (as shown), or may each be a single pattern having line and via portions, but not limited thereto.

It is noted that, the embedded inductor 500 (shown in FIG. 1) and the metallization patterns for each redistribution layer 210, 220, 230, 240, and 250 may be formed concurrently. That is to say, turns or loops of the inductor 500 are formed through the same forming processes using the same method and materials of the metallization patterns, but not limited thereto. A brief description of fabricating the inductor structure having an inductor 500 is provided below.

Referring to FIG. 3 and FIG. 6, after forming the first redistribution layer 210, a second redistribution layer 220 is formed over the first redistribution layer 210. Conductive lines 224 (e.g. second conductive lines) are formed on and electrically connected to the first dielectric layer 212 and the conductive vias 216. The conductive vias 226 (e.g., second conductive vias) are formed on and electrically connected to the conductive lines 224. The conductive lines 224 and the conductive vias 226 together form the metallization pattern, and the dielectric layer 222 and the metallization pattern form the redistribution layer 220. The conductive lines 224, the conductive vias 226 and the dielectric layer 222 may be similar to the conductive lines 214, the conductive vias 216 and the dielectric layer 212 described above, and the description is not repeated herein.

For the inductor 500, the second via V2 is formed on and electrically connected the first metal pattern LV1. The second metal pattern LV2 is formed on and electrically connected the second via V2. The second via V2 is disposed between the first metal pattern LV1 and the second metal pattern LV2. The second via V2 and the second metal pattern LV2 may be similar to the first via V1 and the first metal pattern LV1 described above, and the description is not repeated herein. In some embodiments, the first metal pattern LV1 vertically partially overlaps the second metal pattern LV2. For example. outer edges of the first metal pattern LV1 and the second metal pattern LV2 are vertically aligned, but not limited thereto. The second metal pattern LV2 has an open ring shape. The second metal pattern V2 of the inductor 500 serves as a second turn or loop of a coil.

In some embodiments, the conductive vias 226 and the second metal pattern LV2 of the second redistribution layer 220 are located on substantially the same horizontal level (e.g. a second horizontal level) as they are formed on the same horizontal plane by the same formation process. Under the above configurations, the conductive vias 226 of the second redistribution layer 220 and the second metal pattern LV2 of the inductor 500 are formed in the same forming process, so as to simplify the manufacturing process and to save cost. The first horizontal level and the second horizontal level are at different heights along the vertical direction. For example, along a vertical direction or normal direction of the molded layer 280, the first horizontal level is located below the second horizontal level. It is possible that the first horizontal level is located above the second horizontal level, and the relative positions may be changed depending on the sequence of the process steps. Similarly, the first metal pattern LV1 is located below the second metal pattern LV2, and the first metal pattern LV1 and the second metal pattern LV2 are not located at the same level height.

In some other embodiments, the first via V1 and the second via V2 are not vertically aligned. For example, the first via V1 does not overlap the second via V2, which may be defined as an orthographic projection of the first via V1 on the molded layer 280 not being overlapped with an orthographic projection of the second via V2 on the molded layer 280. Moreover, the orthographic projection of the second via V2 on the molded layer 280 completely falls within an orthographic projection of the second metal pattern LV2 on the molded layer 280. Therefore, the outer edges of the second via V2 and the second metal pattern LV2 are not aligned, but not limited thereto.

Referring to FIG. 6, the third redistribution layer 230, the fourth redistribution layer 240 and the fifth redistribution layer 250 are sequentially stacked on the second redistribution layer 260. A third metal pattern LV3 is embedded in the third redistribution layer 230. A fourth metal pattern LV4 is embedded in the fourth redistribution layer 240. A third via V3 is disposed between the second metal pattern LV2 and the third metal pattern LV3. A fourth via V4 is disposed between the third metal pattern LV3 and the fourth metal pattern LV4. A fifth via V5 is embedded in the fifth redistribution layer 250, and is disposed on the fourth metal pattern LV4 and electrically connects to the metallization pattern of the fifth redistribution layer 250. In some embodiments, the metal patterns LV1, LV2, LV3, LV4, and LV5 are aligned, but not limited thereto. The vias V1, V2, V3, V4, and V5 may be staggered and laterally displaced from each other. For example, the first via V1 is not aligned with the second via V2, and the second via V2 is not aligned with the third via V3. The third via V3 is not aligned with the fourth via V4. The fourth via V4 also does not align with the fifth via V5. Under the above configurations, the embedded inductor 500 includes the metal patterns LV1, LV2, LV3, and LV4, and the vias V1, V2, V3, V4 and V5 connecting to each of the corresponding metal patterns LV1, LV2, LV3, and LV4. Thereby, the inductor 500 is a coil having four turns and embedded in the redistribution layers 210, 220, 230, 240, and 250 of the multilayered structure 200. In some other embodiments, the number of turns or loops of the inductor may be dependent or independent on the number of the redistribution layers as desired for a particular design, but the numbers of the turns of the inductor in the multilayered structure 200 are not limited thereto. Since the metal patterns have open ring shape, and each of the metal patterns are connected by a corresponding conductive vias, the inductor 500 may be winded in a clockwise or counterclockwise direction, so as to allow electrically current travelling in the same direction. Therefore, the inductor 500 may be used with the capacitor of the integrated component 400 to form an LC circuit.

Referring to FIG. 6 and FIG. 7, a carrier substrate de-bonding process is performed to detach the carrier substrate 600 from the molded layer 280. The lower redistribution layers 210, 220, 230, 240, 250 and the molded layer 280 are then flipped over and placed on another carrier substrate (not shown) to form the upper redistribution layer 290 on the molded layer 280. In details, the upper redistribution layer 290 are formed on a surface of the molded layer 280 opposite the lower redistribution layer 210, 220, 230, 240, and 250. The upper redistribution layer 290 includes dielectric layer 292 and conductive lines 294. The conductive lines 294 are embedded in the dielectric layer 292, and the conductive lines 294 are electrically connected to the conductive vias 284 or the die connectors 402 of the integrated components 400. Under the above configurations, the integrated components 400 electrically connects the inductor 500 through the conductive lines 294 of the upper redistribution layer 290 and the conductive vias 284 of the molded layer 280. Since the inductor 500 and the integrated components 400 are embedded in the multilayered structure 200, a short electrical path is provided to connect the inductor 500 and the integrated components 400. An LC circuit integrated into the multilayer structure is provided.

In some embodiments, the pitch of the conductive lines 294 in the redistribution layers 290 may be smaller than the pitch of the conductive lines in the lower redistribution layers 210, 220, 230, 240, and 250, but not limited thereto.

The connectors 350 are formed for external connection. The connectors 350 may have bump portions for external connection, and may have via portions extending into the dielectric layer 292 to physically and electrically connect the conductive lines 294. As a result, the connectors 350 may facilitate electrical connection of the integrated circuit dies 300 to the conductive vias 284, the integrated components 400, and the inductor 500. After the formation of the connectors 350, the manufacturing of the multilayered structure 200 is completed. In accordance to an embodiment, the multilayered structure 200 includes lower redistribution layers 210-250, the molded layer 280, the upper redistribution layer 290, the integrated components 400 embedded in the molded layer 280, and the inductor 500 embedded in the lower redistribution layers 210-250. The multilayered structure 200 is placed on a frame 670.

Referring to FIG. 8, the organic substrate 100 is provided. The organic substrate 100 includes an organic core 110. The organic core 110 may be formed of one or more layers of organic materials including polycarbonate (PC), polyimide (PI), polypropylene (PP), polyethylene terephthalate (PET), polybenzoxazole (PBO), benzocyclobutene (BCB) or the likes, but not limited thereto. In some embodiments, the organic substrate 100 may be substituted by a ceramic substrate, a silicon substrate. The through vias 120 are formed extending through the organic core 110. The through vias 120 may include conductive materials and fill material, but not limited thereto. The conductive vias 120 provide vertical electrical connections from one side of the organic core 110 to the other side of the organic core 110. For example, the redistribution structures 140 and 160 are disposed on opposing sides of the organic core 110, and the redistribution structures 140 and 160 are electrically connected by the conductive vias 120.

The redistribution structures 140 and 160 each include dielectric layers, formed of ABF, pre-preg, or the like, and metallization patterns. Each respective metallization pattern has line portions horizontally extending along the surface of the dielectric layer, and has via portions extending through the dielectric layer. In some embodiments, the pitch of the conductive lines of the metallization pattern in the organic substrate 100 may be larger than the pitch of the conductive lines (e.g. the conductive lines 214) of the multilayered structure 200, but not limited thereto. In some embodiments, the pitch of the conductive lines of the organic substrate 100 is larger than the pitch of the conductive lines 214 of the lower redistribution layer 210 and the pitch of the conductive lines 294 of the upper redistribution layer 290. The organic substrate 100 further includes conductive pads 132 and 134 for external connection. The conductive pads 132 and 134 are respectively disposed on the outermost layer of the redistribution structures 140 and 160. The conductive pads 132 and 134 may also be called under-bump metallurgies (UBMs). Optionally, solder resists may be disposed on the outermost surface of the redistribution structures 140 and/or 160 to protect the features of the redistribution structures 140 and/or 160. The conductive connectors 170 are disposed on the conductive pads 132 for electrically connection to the multilayered structure 200 as shown in FIG. 1 and FIG. 9.

Figure 9:
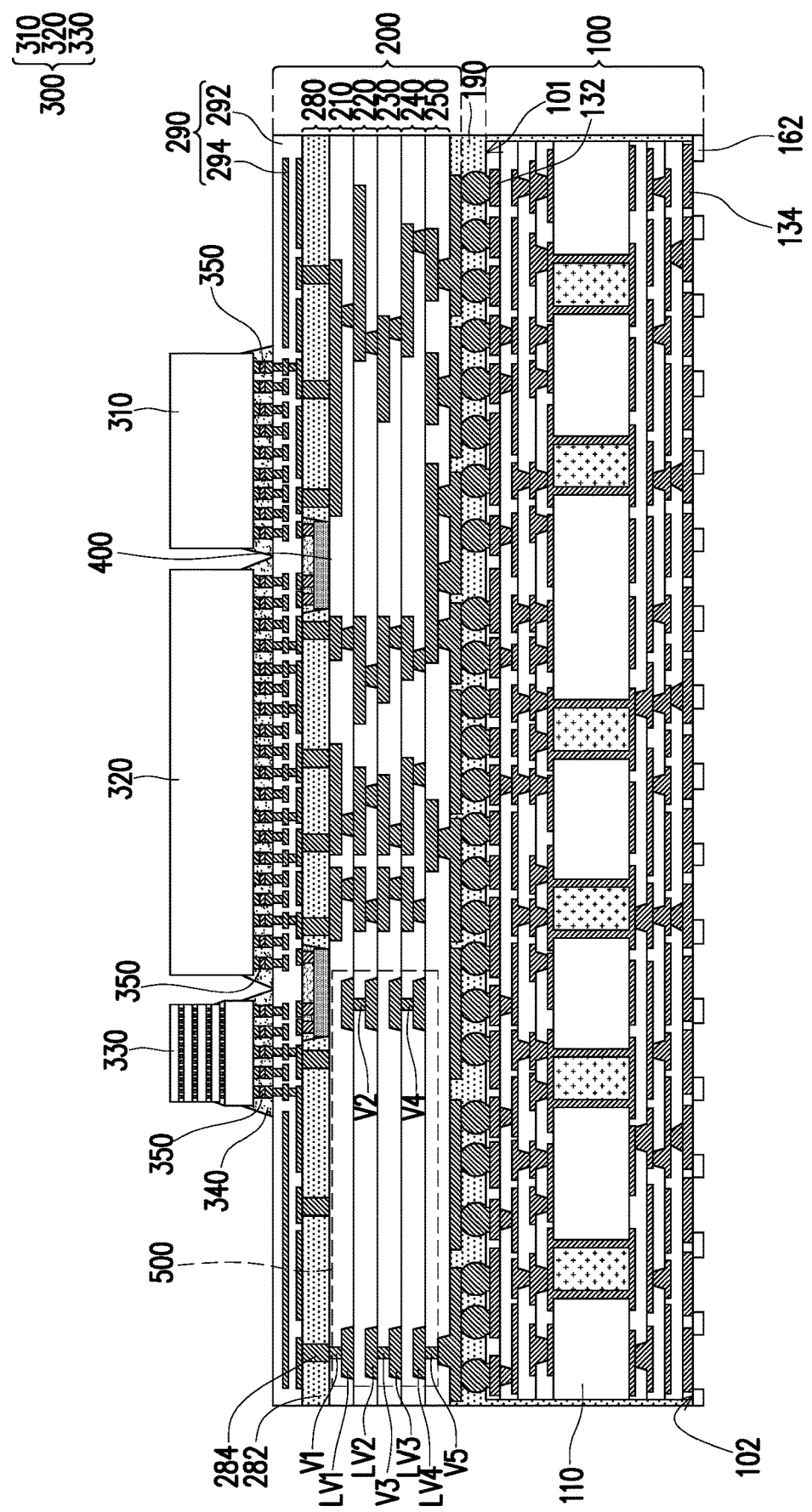

Referring to FIG. 8 and FIG. 9, the conductive connectors 170 may be first formed on the top side 101 of the organic substrate 100, which is opposite to the bottom side 102. The conductive connectors 170 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 170 may include a conductive material such as solder, copper, aluminum, gold, nickel, silver, palladium, tin, the like, or a combination thereof.

The multilayered structure 200 is disposed on the top side 101 of the organic substrate 100. The metallization layer of the lower redistribution layer 150 is electrically connected to the conductive connectors 170. Thereby, the multilayered structure 200 is electrically connected to the organic substrate 100 through the conductive connectors 170.

In FIG. 9, an encapsulant 190 is formed on and around the organic substrate 100. After formation, the encapsulant 190 partially surrounds the organic substrate 100, the conductive connectors 170 and the conductive pads 132. The encapsulant 190 may be formed of a molding compound, epoxy, or the like, and may be applied by compression molding, transfer molding, or the like. The encapsulant 190 may be applied in liquid or semi-liquid form and then subsequently cured.

An optional planarization process may be performed on the encapsulant 190 to remove a portion of the encapsulant 190. After the planarization process, the conductive pads 134 of the organic substrate 100 are exposed. Bottommost surfaces of the encapsulant 190 and the conductive pads 134 are substantially level (e.g., planar) after the planarization process.

In some embodiments, before attaching the integrated circuit dies 300, the multilayered structure 200 and the organic substrate 100 may be removed from the frame 670.

The integrated circuit dies 300, as shown in FIG. 1 and FIG. 9, are attached and bonded to the multilayered structure 200 through the connectors 350. The integrated circuit dies 300, including the first die 310, the second die 320, and the third die 330, are electrically connected to the conductive lines 294, and through the upper redistribution layer 290, the integrated circuit dies 310, 320, and 330 are connected to the integrated components 400 and the inductor 500. The integrated circuit dies 310, 320, and 330 are also connected to each other through the integrated components 400. Attaching the integrated circuit dies 300 may include placing the first die 310, the second die 320, and the third die 330 on the connectors 350 and through a reflow process to bond the integrated circuit dies 300 to the connectors 350 and the multilayered structure 200. Under the above configurations the first die 310, the second die 320 and the third die 330 are disposed on the upper redistribution layer 290 of the multilayered structure 200.

In some embodiments, solder resist 162 is formed on the UBMs 134 after the integrated circuit dies 300 are attached, but not limited thereto. In some other embodiments, the solder resist 162 and the conductive connectors 180 may be formed before attaching the dies. The solder resist 162 has openings that exposed the conductive pads 134. The conductive connectors 180, as shown in FIG. 1, are formed on the conductive pads 134 of the organic substrate 100. The conductive connectors 180 may be ball grid array (BGA) connectors, solder balls, or the like. The semiconductor package 10 including the organic substrate 100, the multilayered structure 200 with embedded integrated components 400 and the inductor 500, and the integrated circuit dies 300 are formed. Under the above configurations, the embedded inductor 500 and the capacitors of the integrated components 400 may be electrically connected to form the LC circuit integrated in the package. Short electrical paths are provided between the inductor 500 and the capacitor, and between the LC circuit and the dies. It is advantageous that the LC circuit provides improved power efficiency to the semiconductor package 10.

Figure 10:
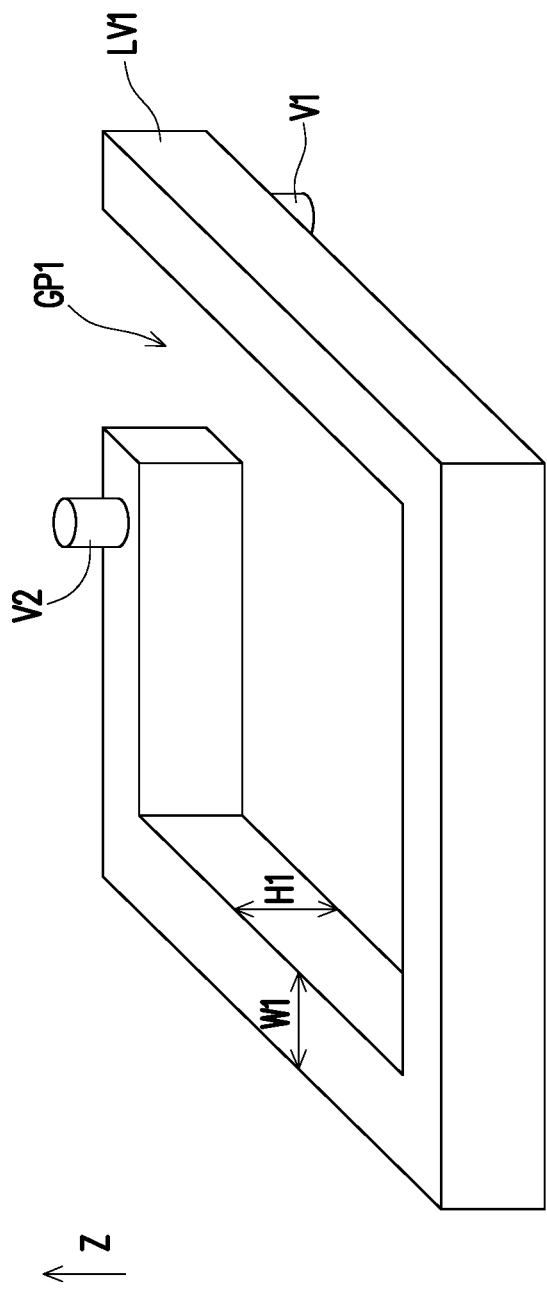
FIG. 10 through FIG. 12 illustrate perspective views of intermediate steps during a process for fabricating an inductor in accordance with some embodiments.
Figure 11:
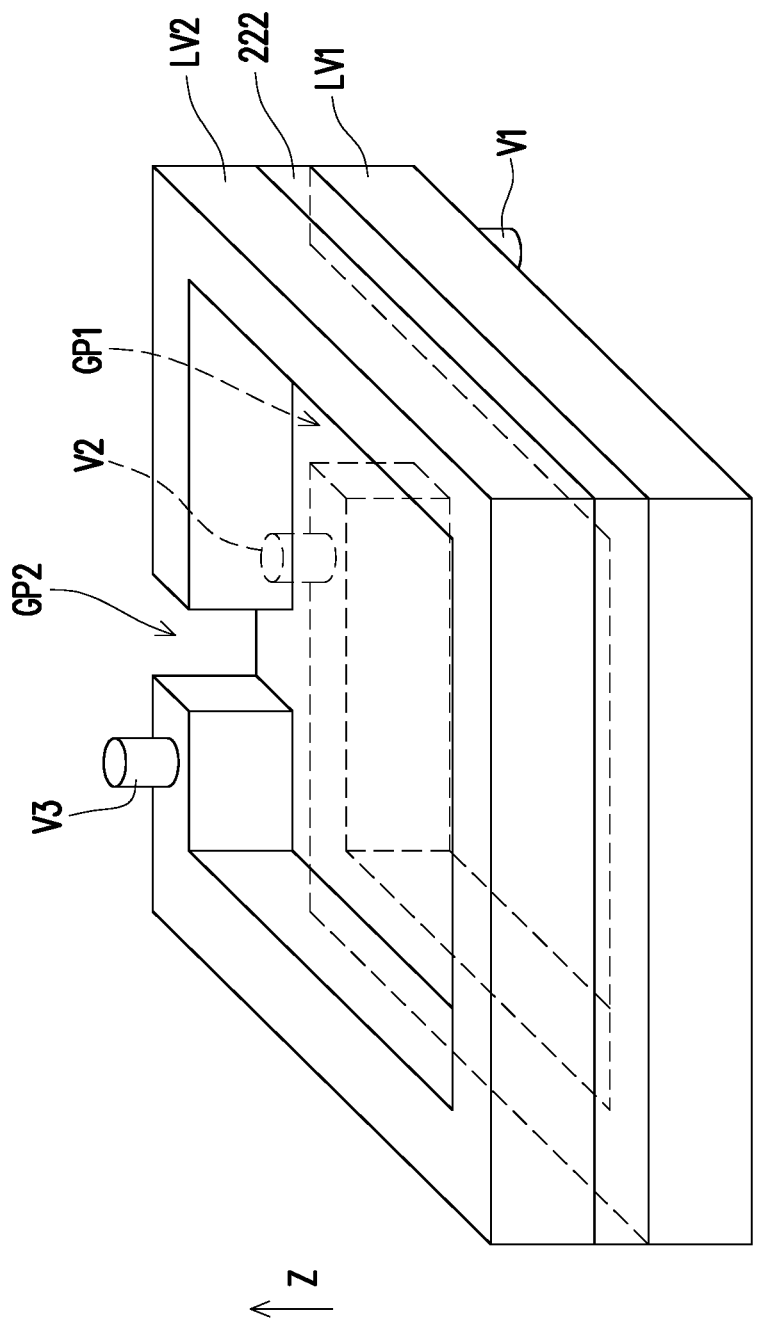
Figure 12:
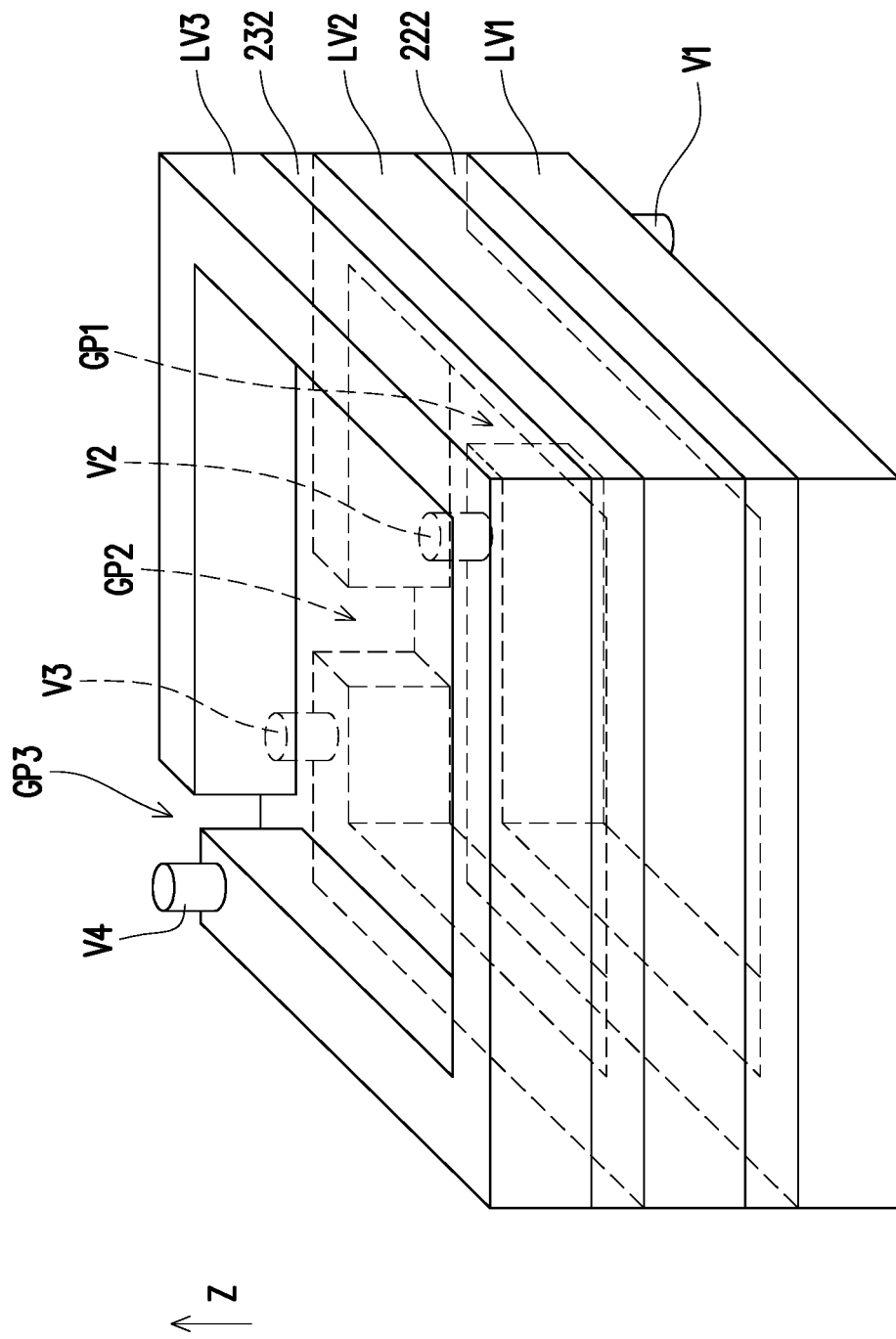

FIG. 10 through FIG. 12 illustrate perspective views of intermediate steps during a process for fabricating an inductor in accordance with some embodiments. Some components or layers are omitted for clarity purpose, for example, the first dielectric layer and the second dielectric layer are not shown. Briefly, the first metal pattern LV1 is shown as a rectangular open ring. The first metal pattern LV1 has a bottom surface (e.g. a first surface) and a top surface opposite the bottom surface (e.g. a second surface). The first via V1 is disposed on the bottom surface and the second via V2 is disposed on the top surface, but not limited thereto. The first metal pattern LV1 has two opposite terminals and the two terminals are not joined. Thereby, the first metal pattern LV1 does not form a closed ring, and instead has a first gap GP1 between the two terminals. In some embodiments, the first via V1 is disposed near one of the two terminals, and the second via V2 is disposed near the other one of the two terminals.

The first metal pattern LV1 has a first width W1, and a first thickness H1. The first width W1 may be equal to or larger than the thickness H1. For example. the first width W1 is 1 to 10 times the thickness H1 (e.g. W1 is 1 to 10 H1). Under the above configurations, the width of the first metal pattern LV1 may be large comparing to the thickness of the first metal pattern LV1. The advantage is that a volume of the first metal pattern LV1 may be increased, so as to reduce electrical resistance, and improve the overall inductance of the inductor 500. For example. the inductance of the inductor 500 is 1 nH to 10 nH, but not limited thereto.

In some embodiments, a thickness of the first via V1 is smaller than the first thickness H1 of the first metal pattern LV1. For example, a ratio of the thickness of the first via V1 to the first thickness H1 is about 0.2 to about 1.0, but not limited thereto.

Referring to FIG. 11, the second metal pattern LV2 is formed over the first metal pattern LV1 on a Z-axis. The Z-axis may be defined as the normal direction (vertical direction or thickness direction) to the dielectric layer 222. A portion of the second dielectric layer 222 is interposed between the first metal pattern LV1 and the second metal pattern LV2. As shown in FIG. 7, the second metal pattern LV2 and the second via V2 are embedded in the redistribution layer 220 (e.g. in the second dielectric layer 222). The second metal pattern LV2 is similar to the first metal pattern LV1, and is shown as a rectangular open ring. The second metal pattern LV2 has two terminals and the two terminals are not joined. Thereby, the second metal pattern LV2 does not form a closed ring, and instead has a second gap GP2 between the two terminals. The second via V2 and the third via V3 are respectively disposed on opposite surfaces of the second metal pattern LV2. For example. the second via V2 is disposed between the first metal pattern LV1 and the second metal pattern LV2. The third via V3 is disposed on a top surface of the second metal pattern LV2. In some embodiments, the second via V2 is disposed near one of the two terminals, and the third via V3 is disposed near the other one of the two terminals. In some embodiments, the first gap GP1 does not overlap the second gap GP2, but not limited thereto. For example, along the Z-axis or the normal direction of the dielectric layer 222, an orthographic projection of the first gap GP1 on the dielectric layer 222 does not overlap an orthographic projection of the second gap GP2 on the dielectric layer 222.

In some embodiments, the thickness of the first via V1 is the same as or different from a thickness of the second via V2 or a thickness of the third via V3. For example, the thickness of the first via V1 may be about 1 time to 2 times the thickness of the second via V2, but not limited thereto.

In some embodiments, the first metal pattern LV1 is completely aligned with the second metal pattern LV2, but not limited thereto. For example, on the Z-axis, an outer edge and an inner edge of the first metal pattern LV1 aligns with an outer edge and an inner edge of the second metal pattern LV2. Under the above configurations, the width of the first metal pattern LV1 is substantially the same as a width of the second metal pattern LV2. Furthermore, on the Z-axis, the first via V1, the second via V2, and the third via V3 do not overlap, but not limited thereto.

Under the above configurations, one of the terminals of the first metal pattern LV1 is connected to one of the terminals of the second metal pattern LV2 through the second via V2. As shown in FIG. 11, An electrical path formed by the first metal pattern LV1 and the second metal pattern LV2 are winded in a clockwise direction. Thereby. The inductor 500 formed by the first metal pattern LV1 and the second metal pattern LV2 are winded in a clockwise direction. In other embodiments, the first metal pattern LV1 and the second metal pattern LV2 are winded in a counterclockwise direction. Therefore, the first metal pattern LV1 and the second metal pattern LV2 together form the coils of the inductor 500.

Referring to FIG. 12, the third metal pattern LV3 is formed over the second metal pattern LV2 on the Z-axis. A portion of the third dielectric layer 232 is interposed between the second metal pattern LV2 and the third metal pattern LV3. Similar to the first metal pattern LV1 and the second metal pattern LV2, the third metal pattern LV3 and the third via V3 are embedded in the third dielectric layer 232. The third metal pattern LV3 is shown as a rectangular open ring. The third metal pattern LV3 has two terminals and the two terminals are not joined. Thereby, the third metal pattern LV3 does not form a closed ring, and instead has a third gap GP3 between the two terminals. The third via V3 and the fourth via V4 are respectively disposed on opposite surfaces of the third metal pattern LV3. For example. the third via V3 is disposed between the second metal pattern LV2 and the third metal pattern LV3. The fourth via V4 is disposed on a top surface of the third metal pattern LV3. In some embodiments, the third via V3 is disposed near one of the two terminals, and the fourth via V4 is disposed near the other one of the two terminals. In some embodiments, the second gap GP2 does not overlap the third gap GP3, but not limited thereto. For example, on the Z-axis, an orthographic projection of the second gap GP2 on the dielectric layer 222 does not overlap an orthographic projection of the third gap GP3 on the dielectric layer 222. In some embodiments, the first gap GP1 does not overlap the second gap GP2 and the third gap GP3.

In some embodiments, the second metal pattern LV2 is completely aligned with the third metal pattern LV3, but not limited thereto. For example, on the Z-axis, an outer edge and an inner edge of the second metal pattern LV2 aligns with an outer edge and an inner edge of the third metal pattern LV3. Under the above configurations, the width of the first metal pattern LV1 and/or the width of the second metal pattern LV2 are substantially the same as a width of the third metal pattern LV3. Furthermore, on the Z-axis, the first via V1, the second via V2, the third via V3, and the fourth via V4 do not overlap, but not limited thereto.

Under the above configurations, one of the terminals of the third metal pattern LV3 is connected to one of the terminals of the second metal pattern LV2 through the via V3. The first metal pattern LV1, the second metal pattern LV2, and the third metal pattern LV3 are winded in the clockwise direction, but not limited thereto. In other embodiments, the first metal pattern LV1, the second metal pattern LV2, and the third metal pattern are winded in the counter-clockwise direction. Therefore, the first metal pattern LV1, the second metal pattern LV2, and the third metal pattern LV3 together form the coils of the inductor 500. As shown in FIG. 12, the inductor 500 may include three metal patterns and is an inductor with three turns or loops, but the embodiment is not limited thereto. As shown in FIG. 1, the inductor 500 may have four metal patterns (e.g. four turns). In some other embodiments, the number of metal patterns in the inductor 500 may be more or less, and is not limited thereto.

Figure 13:
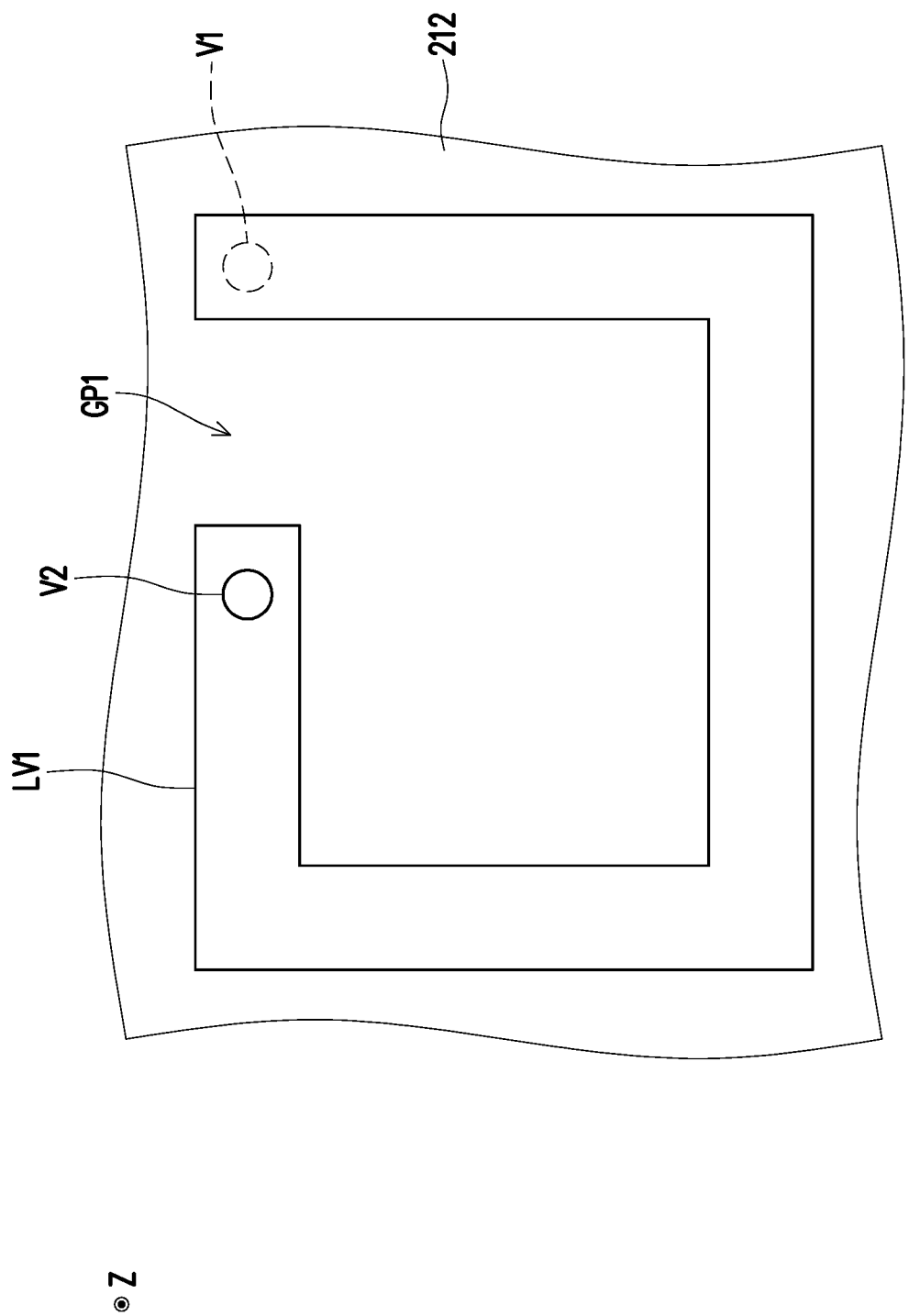
FIG. 13 through FIG. 15 illustrate planar views of first metal patterns in accordance with various embodiments.
Figure 14:
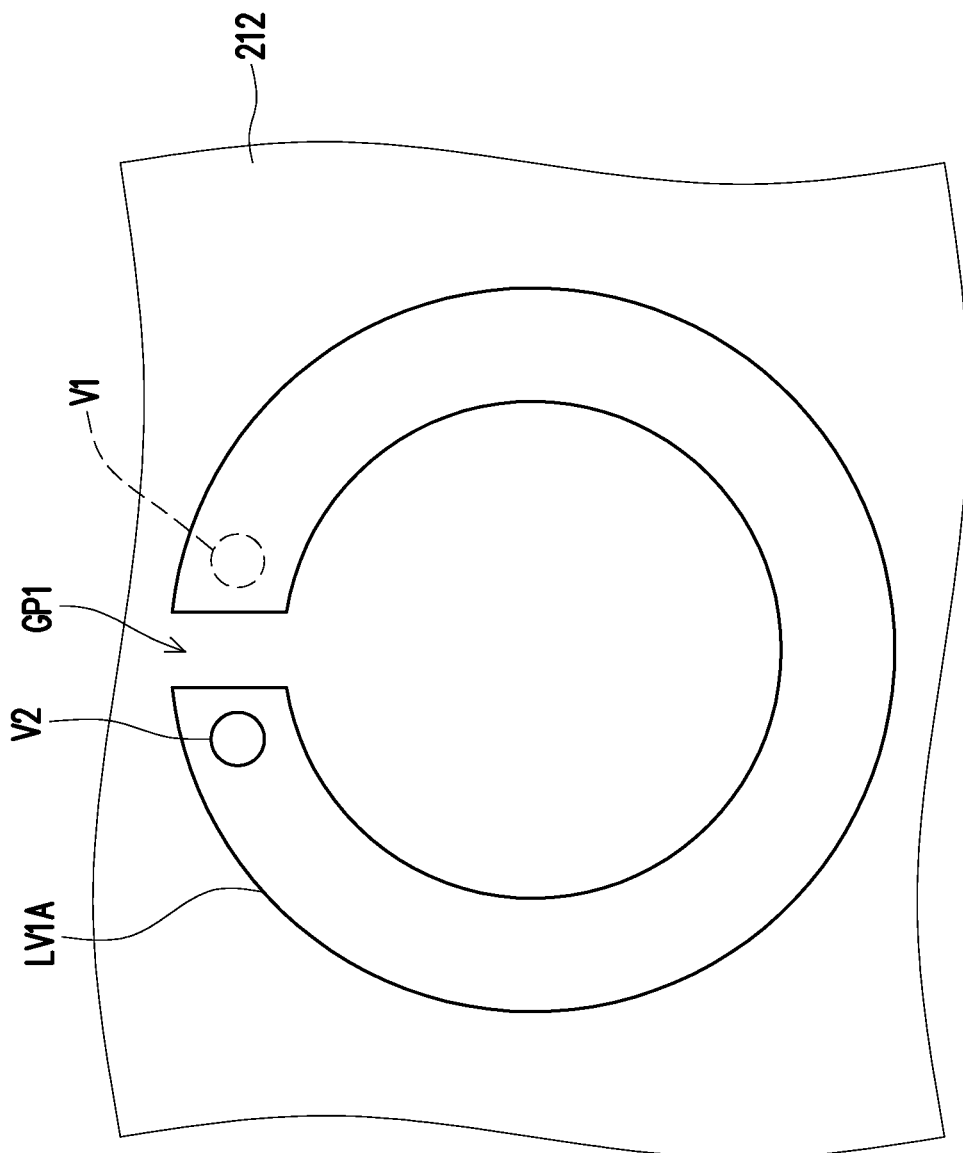
Figure 15:
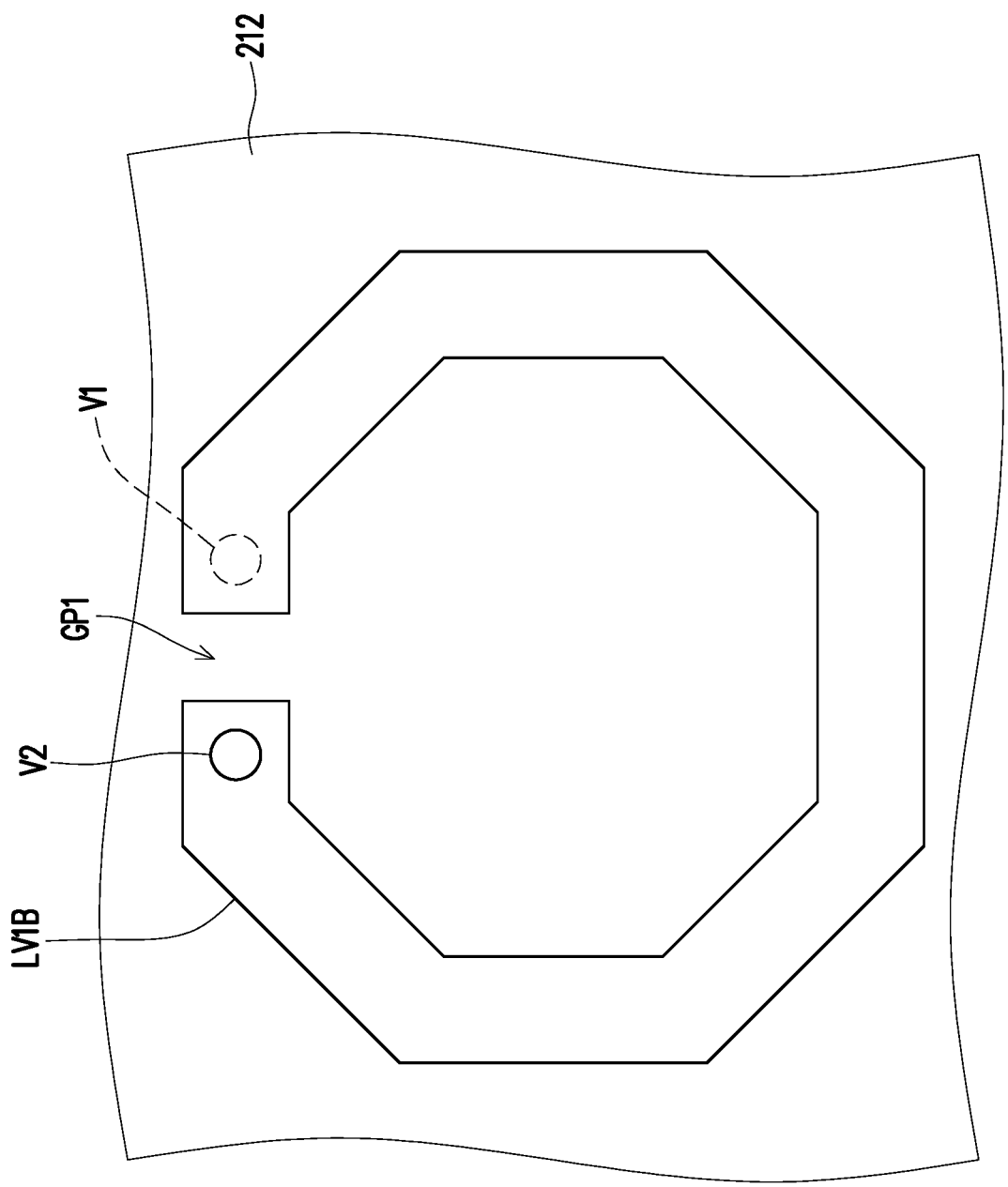

FIG. 13 through FIG. 15 illustrate planar views of first metal patterns in accordance with various embodiments. Referring to FIG. 13, the fist metal pattern LV1 is embedded in the first dielectric layer 212. The first via V1 is disposed under the bottom surface of the first metal pattern LV1, and the second via V2 is disposed over the top surface of the first metal pattern LV1. In a planar view, the first metal pattern LV1 is a rectangular open ring with the first gap GP1 between two terminals of the first metal pattern LV1.

Referring to FIG. 14, in a planar view, the first metal pattern LV1A is a circular open ring with the first gap GP1 between two terminals of the first metal pattern LV1A, but not limited thereto.

Referring to FIG. 15, in a planar view, the first metal pattern LV1B is an octagonal open ring with the first gap GP1 between two terminals of the first metal pattern LV1B, but not limited thereto. Although not shown, the metal patterns may be an open ring with various geometric shapes, including a triangular open ring, an oval open ring or any other suitable shaped open ring, but not limited thereto. Furthermore, each of the metal patterns in the inductor may be of different shaped open ring, the embodiment is not limited thereto.

Figure 16:
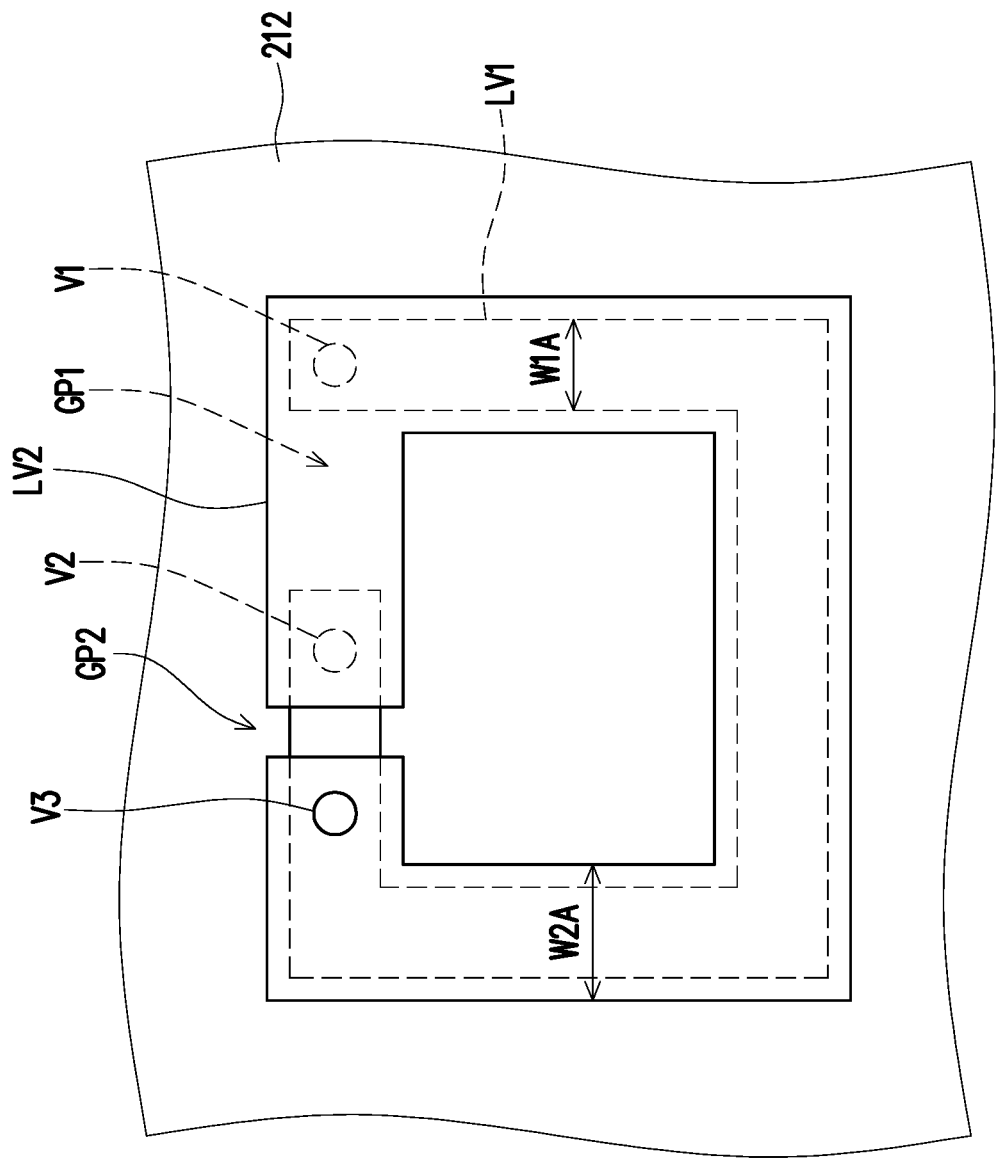
FIG. 16 through FIG. 20 illustrate planar views of the inductors in accordance with various embodiments.

FIG. 16 through FIG. 20 illustrate planar views of the inductors in accordance with various embodiments. Referring to FIG. 16, the first metal pattern LV1 and the second metal pattern LV2 of the inductor 500A are shown. The second metal pattern LV2 does not completely align the first metal pattern LV1. Specifically, the width W2A of the second metal pattern LV2 is larger than the width W1A of the first metal pattern LV1. Thereby, on the Z-axis, an orthographic projection of the contour of the first metal pattern LV1 on the dielectric layer 212 is within an orthographic projection of the contour of the second metal pattern LV2. Therefore, the first metal pattern LV1 is at least partially overlapped by the second metal pattern LV2. In another perspective, a lateral gap is between the outer edge of the first metal pattern LV1 and the outer edge of the second metal pattern LV2.

Figure 17:
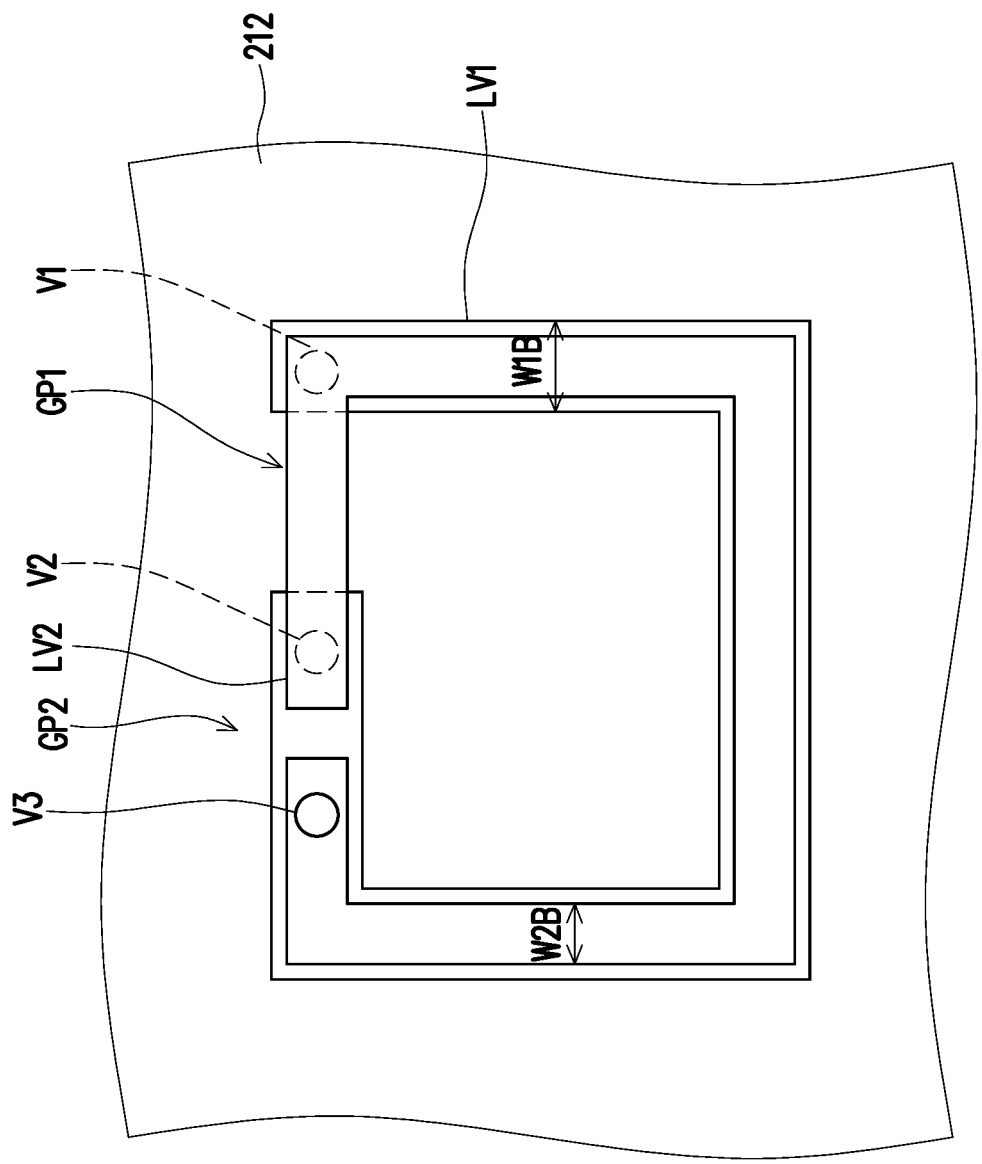

Referring to FIG. 17, the first metal pattern LV1 and the second metal pattern LV2 of the inductor 500B are shown. The second metal pattern LV2 does not completely align the first metal pattern LV1. Specifically, the width W2B of the second metal pattern LV2 is less than the width W2A of the first metal pattern LV1. Thereby, on the Z-axis, the orthographic projection of the contour of the second metal pattern LV2 on the dielectric layer 212 is within the orthographic projection of the contour of the first metal pattern LV1. In another perspective, a pitch of first metal pattern LV1 is larger than a pitch of the second metal pattern LV2.

Figure 18:
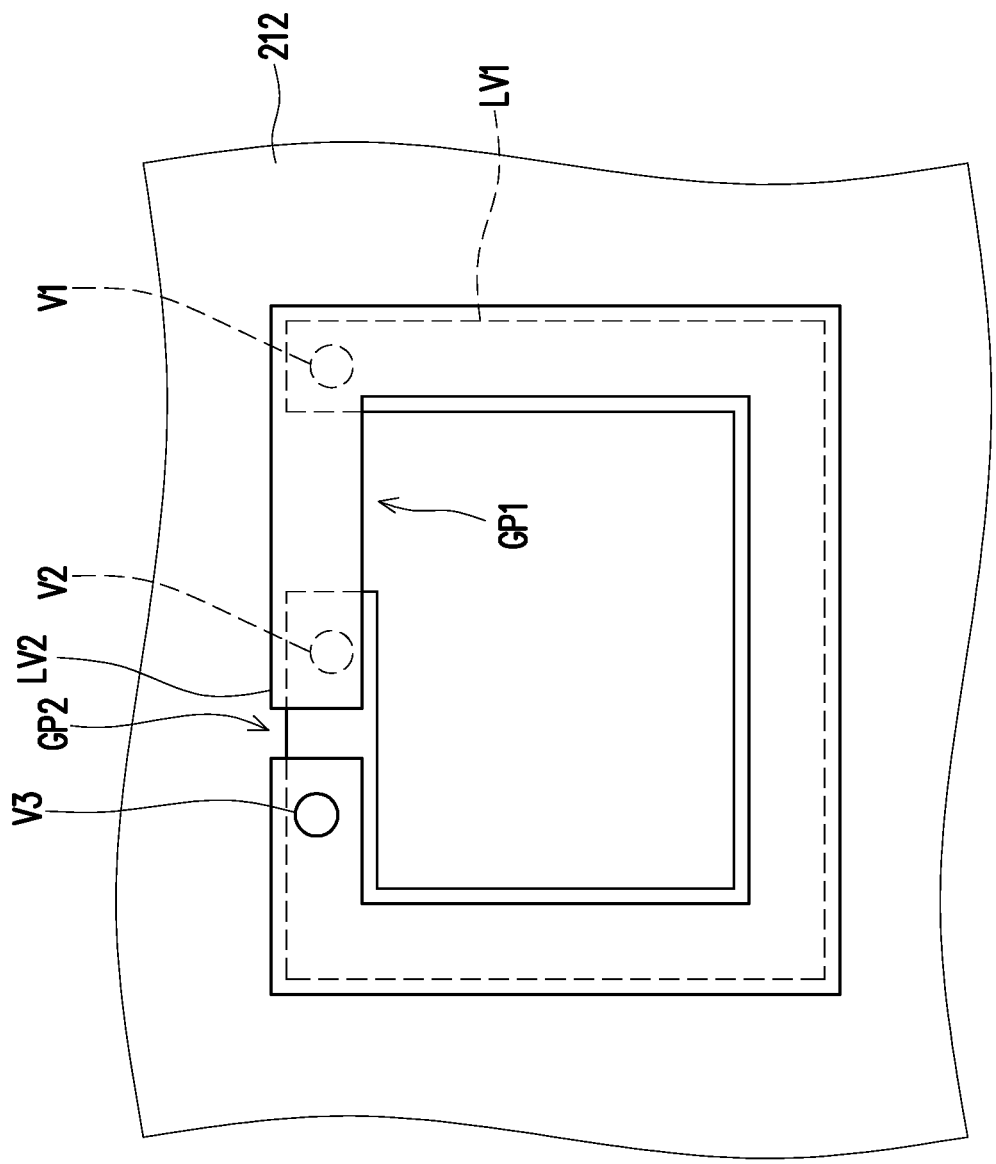

Referring to FIG. 18, the first metal pattern LV1 and the second metal pattern LV2 of the inductor 500C are shown. The second metal pattern LV2 does not completely align the first metal pattern LV1. Specifically, the width of the second metal pattern LV2 is the same as the width of the first metal pattern LV1. The outer edge of the of second metal pattern LV2 is horizontal shifted outward compared to the first metal pattern LV1. In another perspective, the outer edge of the second metal pattern LV2 shifts outward and does not align with the outer edge of the first metal pattern LV1, and the inner edge of the of the second metal pattern LV2 shifts onto the first metal pattern LV1 and does not align with the inner edge of the first metal pattern LV1. On the Z-axis, the orthographic projection of the second metal pattern LV2 on the dielectric layer 212 at least partially overlaps the orthographic projection of the first metal pattern LV1 on the dielectric layer 212.

Figure 19:
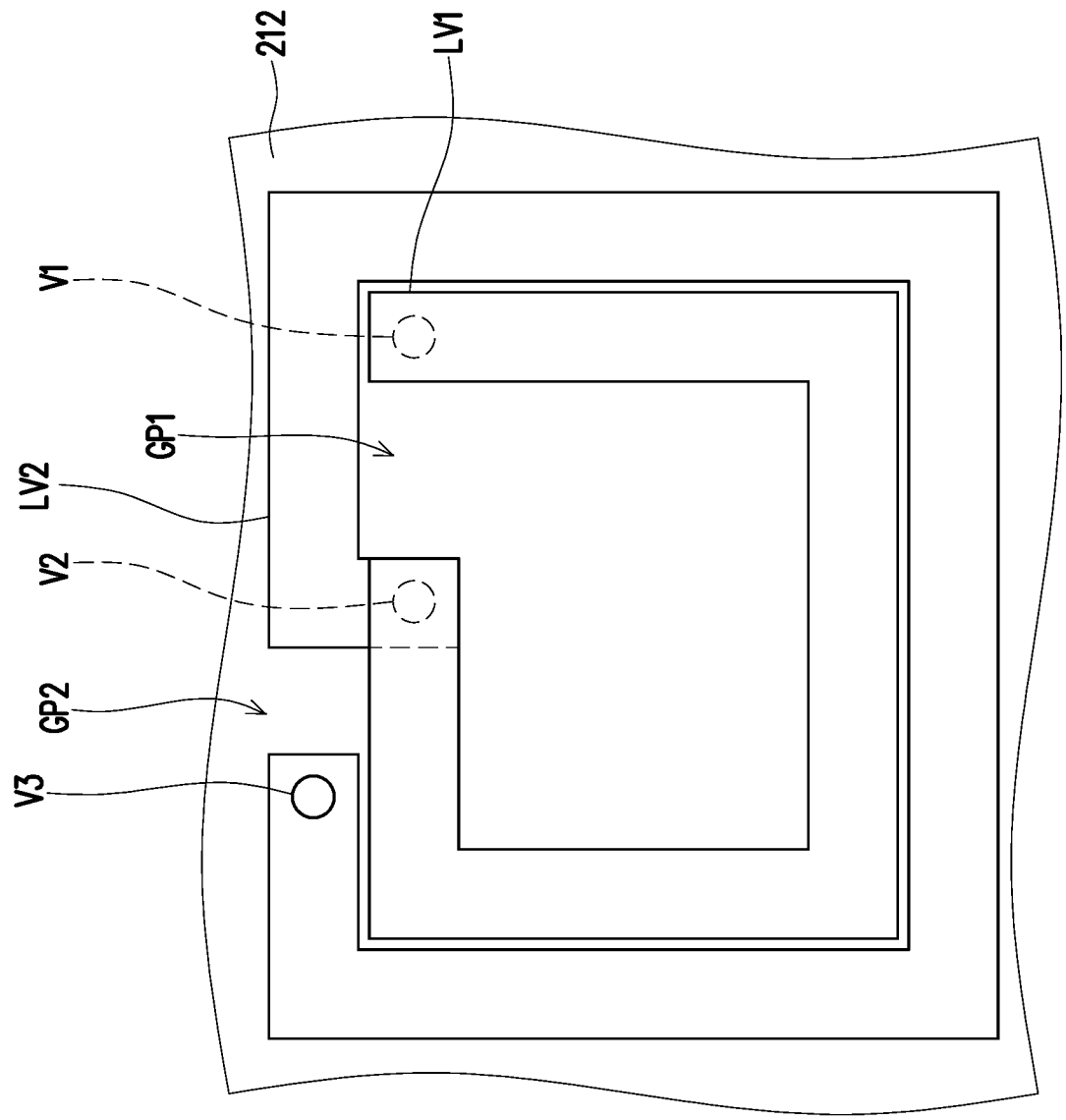

Referring to FIG. 19, the first metal pattern LV1 and the second metal pattern LV2 of the inductor 500D are shown. On the Z-axis, the orthographic projection of the second metal pattern LV2 on the dielectric layer 212 partially surrounds the orthographic projection of the first metal pattern LV1 on the electric layer 212. Specifically, a terminal of the second metal pattern LV2 connects the first metal pattern LV1 through the second via V2. The terminal of the second metal pattern LV2 extends outward and away from the first metal pattern LV1. The second metal pattern LV2 then surrounds the first metal pattern LV1 on the Z-axis. In another perspective, the second metal pattern LV2 overlaps the first metal pattern LV1 at a location where the metal patterns LV1 and LV2 are connected by the second via V2.

Figure 20:
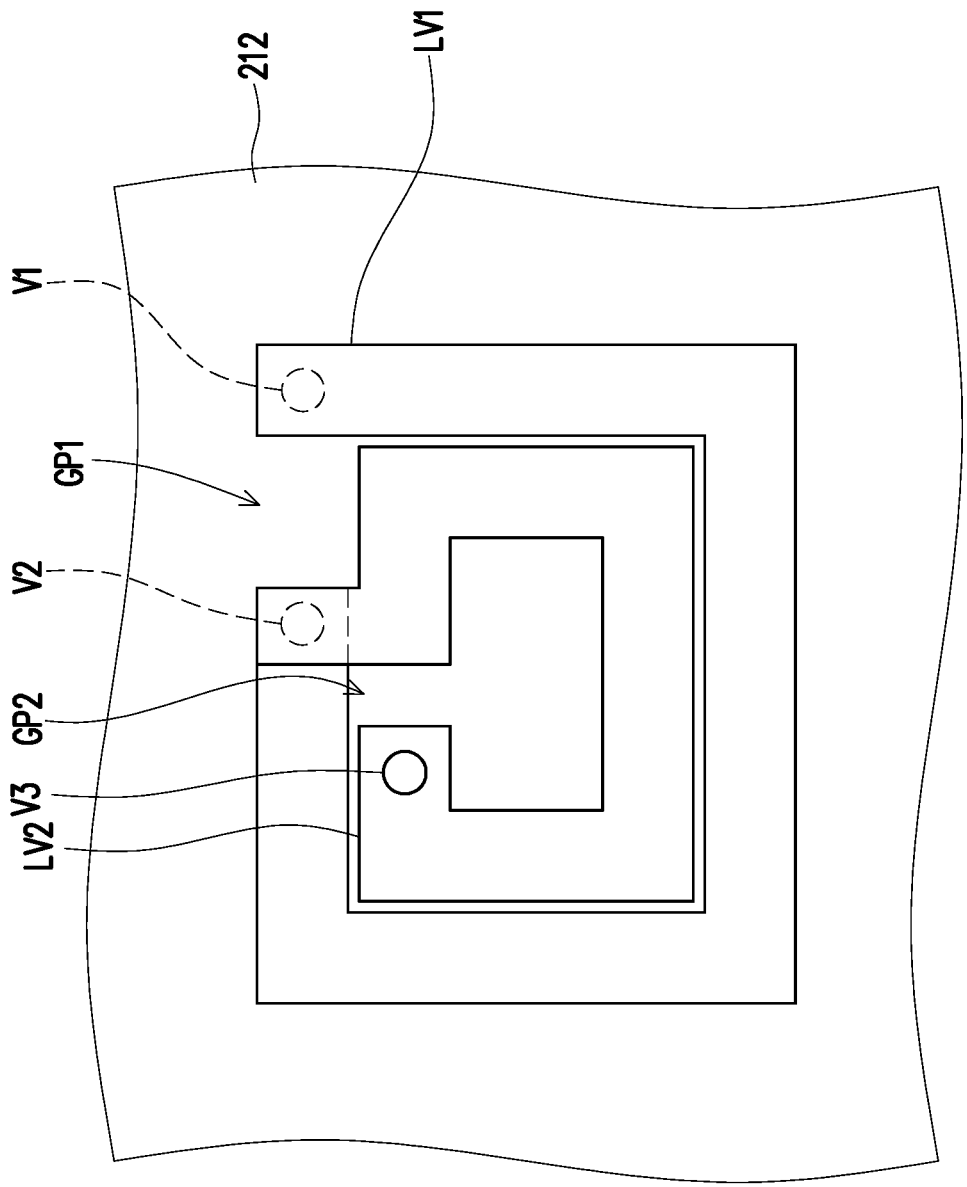

Referring to FIG. 20, the first metal pattern LV1 and the second metal pattern LV2 of the inductor 500E are shown. On the Z-axis, the orthographic projection of the first metal pattern LV1 on the dielectric layer 212 partially surrounds the orthographic projection of the second metal pattern LV2 on the electric layer 212. Specifically, a terminal of the second metal pattern LV2 connects the first metal pattern LV1 through the second via V2. The terminal of the second metal pattern LV2 extends inward and towards the center of the open ring formed by the first metal pattern LV1. The second metal pattern LV2 is then surrounded by the first metal pattern LV1 on the Z-axis. In another perspective, the second metal pattern LV2 overlaps the first metal pattern LV1 at a location where the metal patterns LV1 and LV2 are connected by the second via V2.

Figure 21:
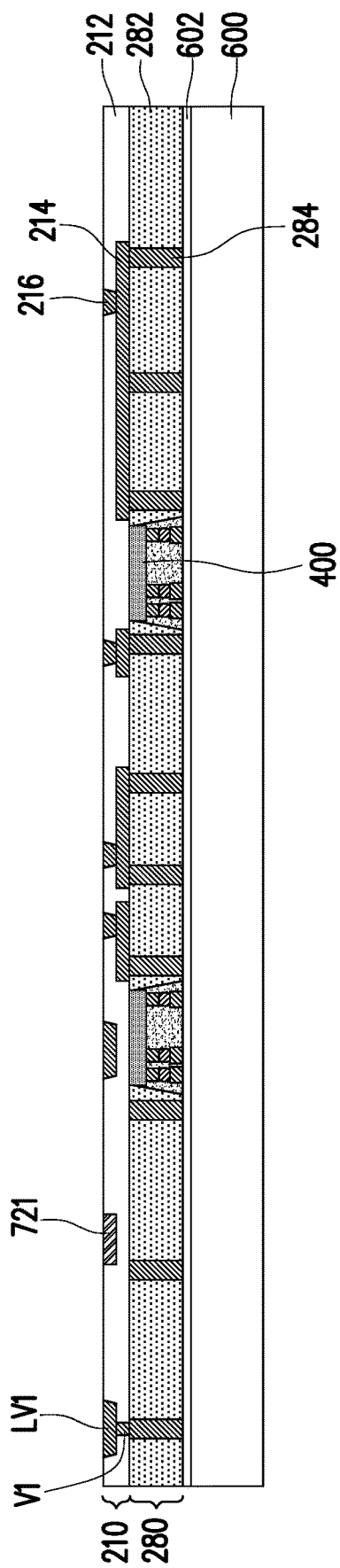
FIG. 21 through FIG. 22 illustrate cross-sectional views of intermediate steps during a process for fabricating a semiconductor package in accordance with some embodiments.
Figure 22:
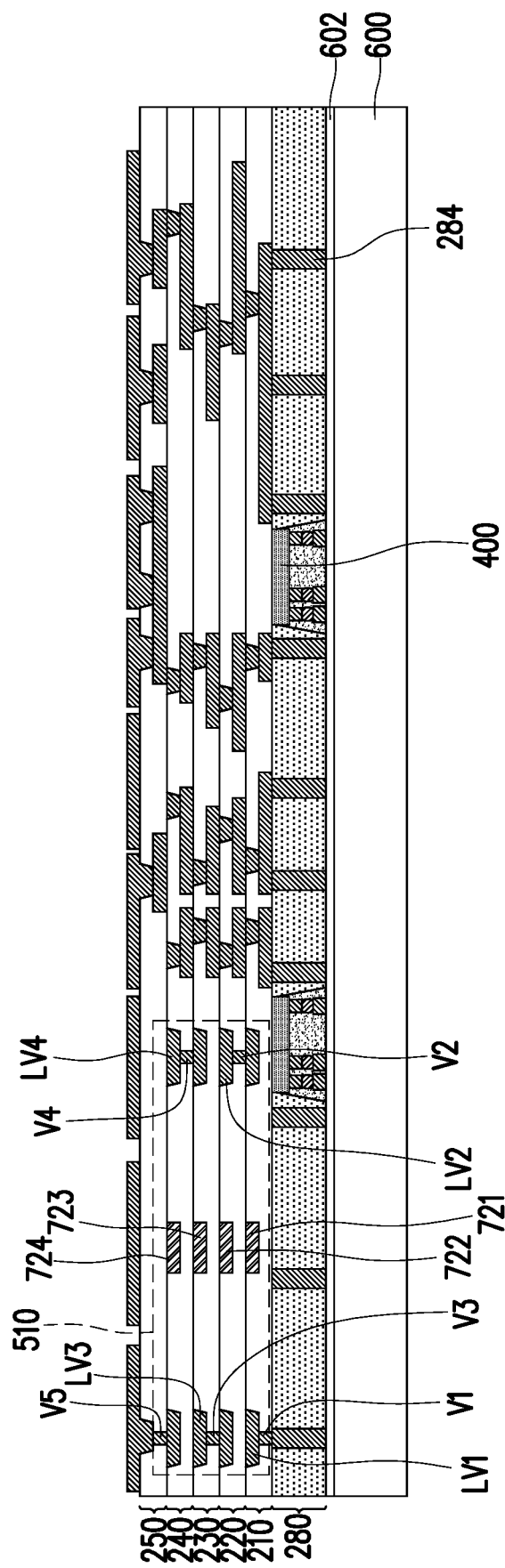
Figure 23:
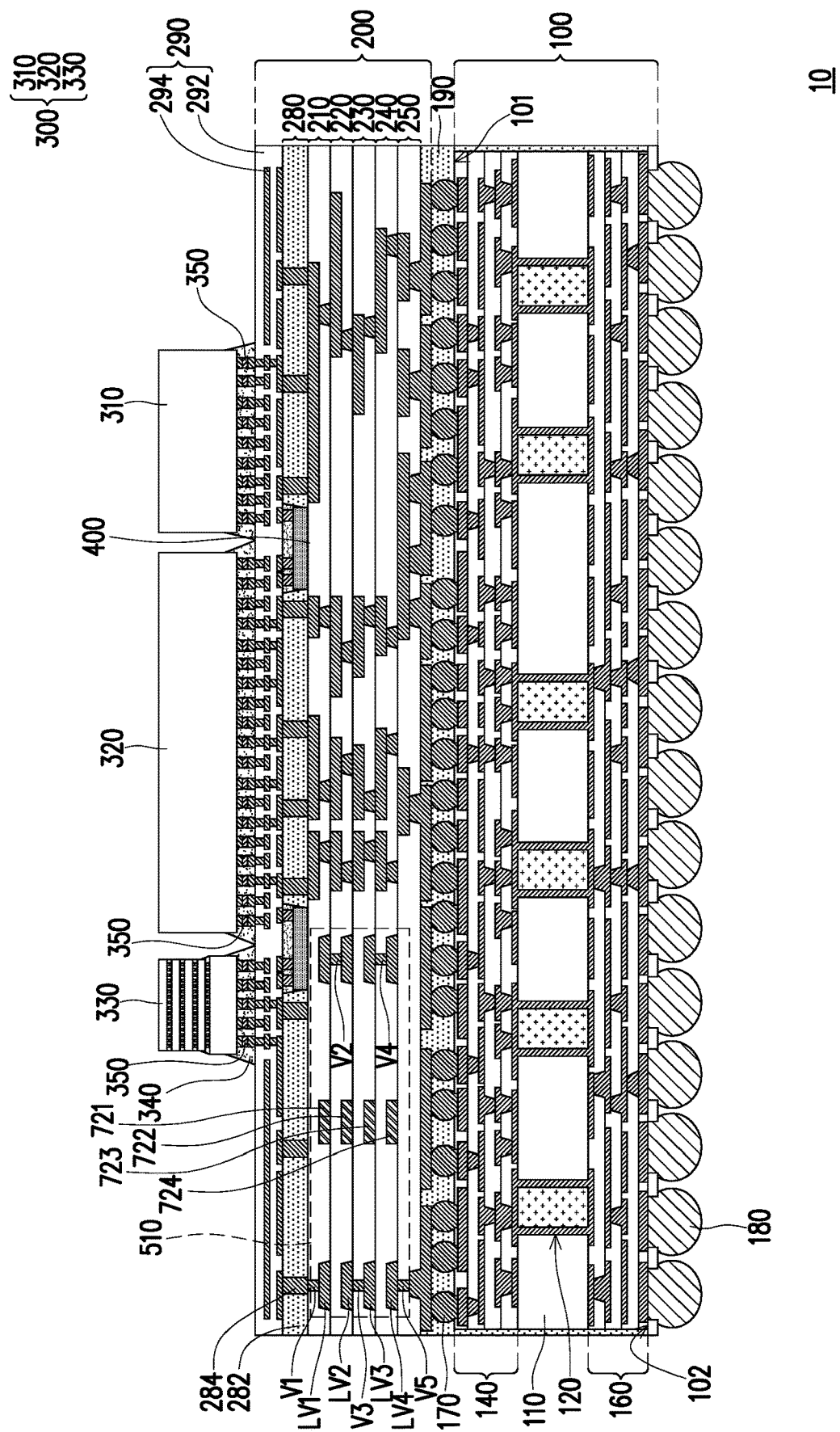
FIG. 23 illustrates a cross-sectional view of a semiconductor package in accordance with some embodiments.

FIG. 21 through FIG. 23 illustrate cross-sectional views of intermediate steps during a process for fabricating a semiconductor package in accordance with some embodiments. The fabricating process of a semiconductor package 10A is substantially similar to the fabricating process of the semiconductor package 10 described above and the description is not repeated herein. Referring to FIG. 21, after forming the first metal pattern LV1 shown in FIG. 3, a first magnetic core 721 is formed in the dielectric layer of the redistribution layer 210. and the first magnetic core 721 is at least partially surrounded by the first metal layer LV1. The first magnetic core 721 and the first metal pattern LV1 are embedded in the first dielectric layer 212. A top surface of the first magnetic core 721, the top surface of the first metal pattern LV1 and the top surface of the first dielectric layer 212 may be substantially level (e.g. planar) within process variations.

As an example of the formation of the first magnetic core 721, a photoresist (not shown) is formed over the first dielectric layer 212. The photoresist is then patterned through a photolithography process. The patterning forms openings through the photoresist to expose the first dielectric layer 212. The first dielectric layer 212 is then patterned to form an opening corresponding to the first magnetic core 721. In some embodiments, the first dielectric layer 212 is patterned through etching processes such as a reactive ion etch (RIE) or the like. The photoresist is then removed in a stripping process, exposing the first dielectric layer 212. A seed layer (not shown) is formed over the first dielectric layer 212, the conductive via 216, the first metal pattern LV1, and the opening. A magnetic material is then formed in the opening and on the seed layer. The magnetic material may be formed by plating. The magnetic material may comprise cobalt (Co), zirconium (Zr), or tantalum (Ta), but not limited thereto. The combination of the magnetic material and underlying portions of the seed layer form the first magnetic core 721. In some embodiments, the permeability ($\mu$) of the first magnetic core 721 is substantially 10 times to 100 times the vacuum permeability ($\mu_o$), but not limited thereto. Then, portions of the first dielectric layer 212, the seed layer and the magnetic material are removed in a planarization process, such as CMP.

In some embodiments, the first magnetic core 721 is formed concurrently in the forming process of the first metal pattern LV1. Under the above configurations, the first metal pattern LV1 and the first magnetic core 721 of the inductor 510 may be formed in a same process, so as to simplify the manufacturing process and to save cost.

After performing the planarization process, the top surface of the first magnetic core 721 and the top surface of the first metal pattern LV1 are level with the top surface of the first dielectric layer 212. The first magnetic core 721 and the first metal pattern may be on a substantially similar horizontally level, but not limited thereto. Under the above configurations, the first metal pattern LV1 partially surrounds the first magnetic core 721. The advantage of the first magnetic core 721 lies in that the inductance of the inductor 510 is improved and the overall power efficiency of the LC circuit may be improved.

Referring to FIG. 22, the steps and process of fabricating the multilayered structure 200, the embedded metal patterns LV2, LV3, LV4, and the magnetic cores 722, 723, 724 are repeated to form the embedded inductor 510. Specifically, the multilayered structure 200 includes redistribution layers 210, 220, 230, 240, and 250 with embedded metal patterns LV1, LV2, LV3, and LV4. Each of the metal patterns partially surrounds a magnetic core embedded in the respective redistribution layer. For example. the second metal patterns LV2 partially surrounds a second magnetic core LV2 embedded in the second redistribution layer 220. In some embodiments, the second magnetic core 722 is formed over the first magnetic core 721. Specifically, an orthographic projection of the first magnetic core 721 on the molded layer 280 at least partially overlaps an orthographic projection of the second magnetic core 722 on the molded layer 280. In some embodiments, the first magnetic core 721 may completely overlap and/or align the second magnetic core 722, but not limited thereto. In some other embodiments, the first magnetic core 721 may also not overlap and/or align the second magnetic core 722.

As shown in FIG. 22, in some embodiments, the magnetic cores 721, 722, 723, and 724 are aligned, but not limited thereto. Each of the magnetic cores 721, 722, 723, and 724 may also have different shapes or volumes and are not limited to the figures shown herein. In some embodiments, a volume of the magnetic core 721 is less than the volume of the space encircled by the first metal pattern LV1. That is, the outer edge of the magnetic core 721 may be adjacent to or close to the inner edge of the first metal pattern LV1, but the magnetic core 721 is kept spaced apart and separated from the first metal pattern LV1 with the dielectric layer filled therebetween.

FIG. 23 illustrates a cross-sectional view of a semiconductor package in accordance with some embodiments. Referring to FIG. 1 and FIG. 23, the difference between the semiconductor package 10 in FIG. 1 and the semiconductor package 10A in FIG. 23 is that the embedded inductor 510 includes a coil formed by metal patterns and magnetic cores surrounded by the coil. As shown in FIG. 23, the inductor 510 includes four metal patterns and four magnetic cores, but not limited thereof. In some embodiments, the number of the metal patterns and the magnetic cores of the inductor 510 may be more, or less than four. The number of the metal patterns may be the same, more, or less than the number of the magnetic cores. For example. the magnetic patterns of the inductor 510 may surrounds a single magnetic core embedded in multiple redistribution layers. Under the above configurations, the embedded inductor 510 and the capacitors of the integrated components 400 may form an LC circuit integrated in the package which provides improved power efficiency.

Figure 24:
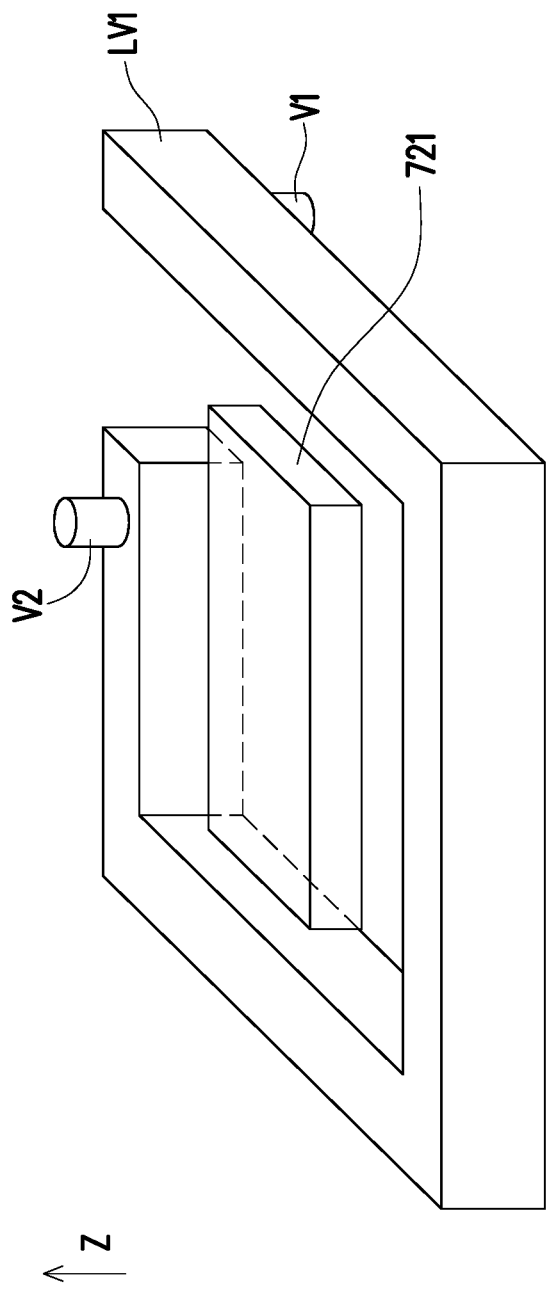
FIG. 24 through FIG. 26 illustrate perspective views of intermediate steps during a process for fabricating an inductor in accordance with some embodiments.
Figure 25:
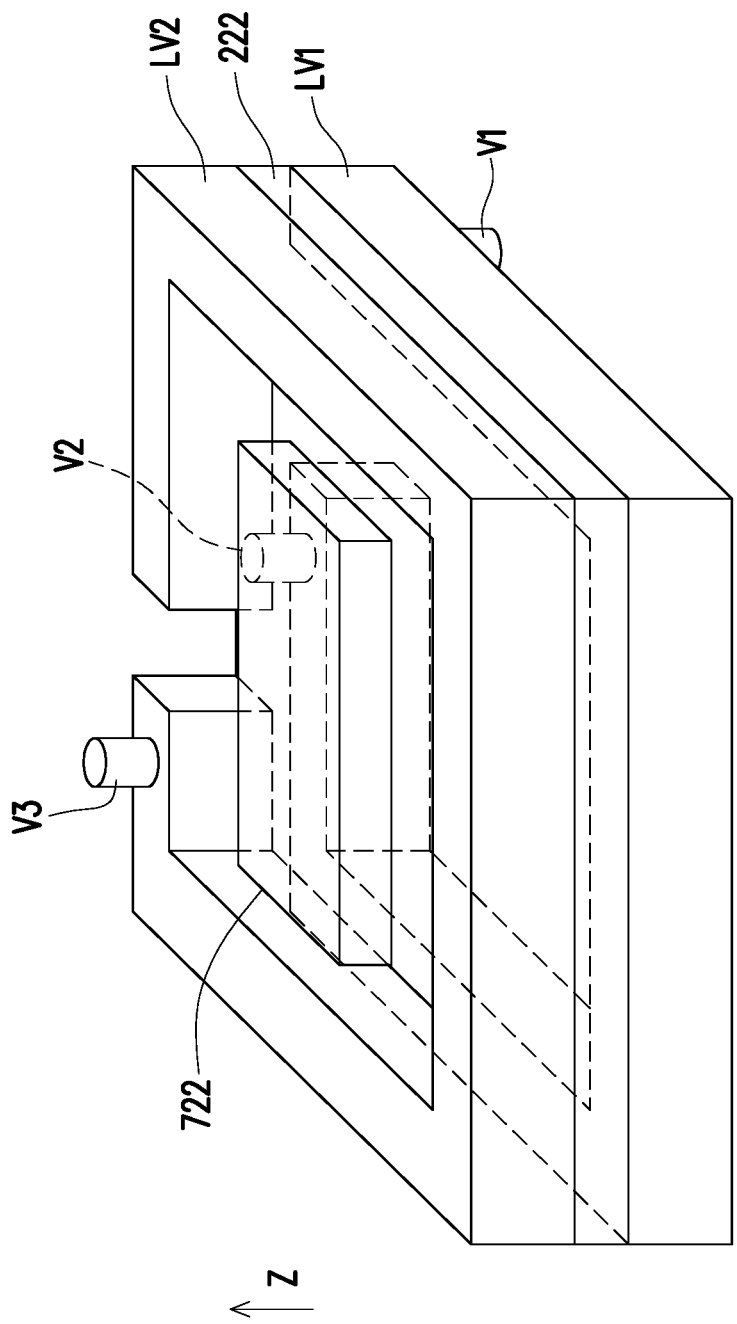
Figure 26:
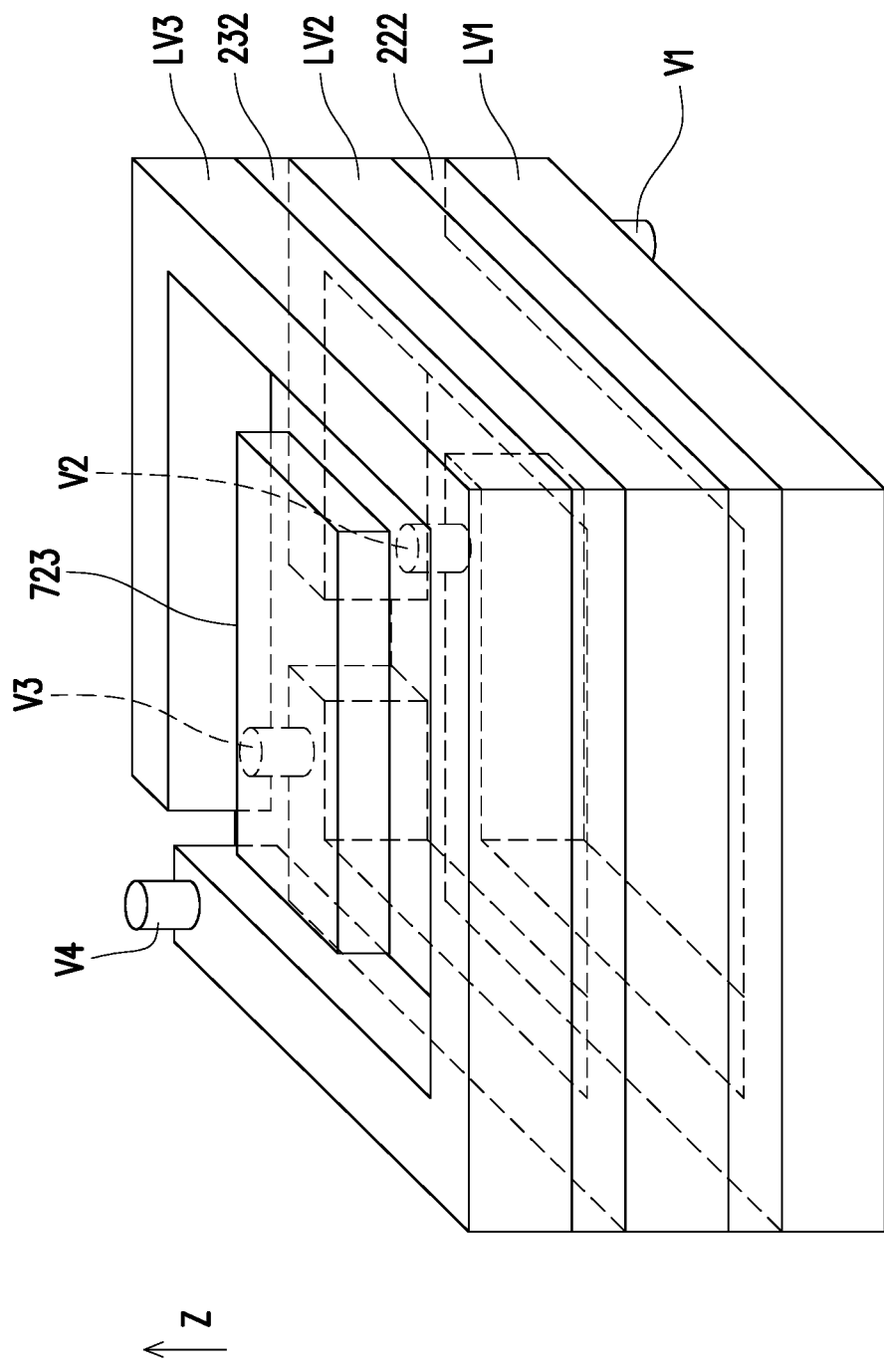

FIG. 24 through FIG. 26 illustrate perspective views of intermediate steps during a process for fabricating an inductor in accordance with some embodiments. Some components or layers are omitted for clarity purpose, for example, the first dielectric layer and the second dielectric layer are not shown in FIG. 24. Please also refer to FIG. 10, FIG. 11, and FIG. 12, the inductor 510 shown in FIG. 24 through FIG. 26 is substantially similar to the inductor 510 shown in FIG. 10 through FIG. 12. As shown in FIG. 10 and in FIG. 24, the main difference is that in FIG. 24, the first magnetic core 721 is surrounded by the first metal patterns LV1. The magnetic core 721 may be a rectangular cuboid, but not limited thereto. In some embodiments, the magnetic core 721 may be a cylinder, a ball, a cube, or the like.

Please refer to FIG. 25, the second magnetic core 722 is embedded in the dielectric layer 222 and surrounded by the second metal pattern LV2. The first metal core 721 is omitted for clarity purpose. The second magnetic core 722 is disposed over the first magnetic core 721, and the second magnetic core 722 aligns with the first magnetic core 721, but not limited thereto.

Please refer to FIG. 26, the third magnetic core 722 is embedded in the third dielectric layer 232 and surrounded by the third metal pattern LV3. The first metal core 721 and the second magnetic core 722 are omitted for clarity purpose. The third magnetic core 723 is disposed over the second magnetic core 722 and the third magnetic core 723 aligns with the second magnetic core 722, but not limited thereto.

Figure 27:
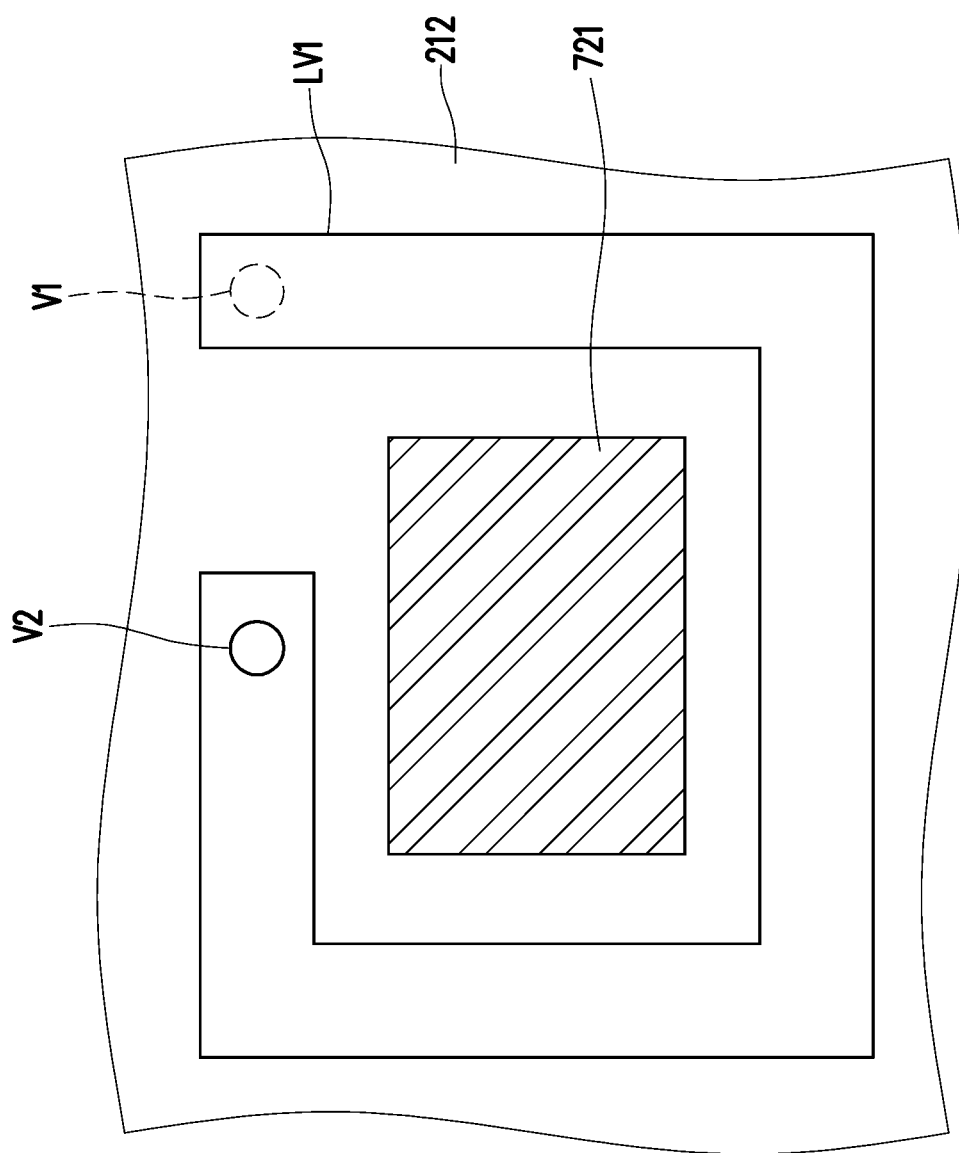
FIG. 27 illustrates planar view of an inductor in accordance with some embodiments.

FIG. 27 illustrates planar view of an inductor in accordance with some embodiments. Referring to FIG. 27, the first magnetic core 721 is partially surrounded by the first metal pattern LV1 on the Z-axis. In some embodiments, the first magnetic core 721 is separated from the first metal pattern LV1 by the first dielectric layer 212. In some embodiments, the first magnetic core 721 and the first metal pattern LV1 are on a substantially similar horizontally level. In some embodiments, on the Z-axis, the contour of the metal pattern and the contour of the magnetic core may be similar. For example, the contour of the first metal pattern LV1 and the contour of the first magnetic core 721 are rectangular. In some other embodiments, the contour of the first metal pattern LV1 and the contour of the first magnetic core 721 are triangular, square, polygonal, circular, oval, or irregular, but not limited thereto.

In some other embodiments, a hole (not shown) may be formed in the first dielectric layer 212, and the hole is surrounded by the first metal pattern LV1. The hole may be filled with air, but not limited thereto. Thereby, each of the metal patterns of the inductor is said to surround an air core.

In the above-mentioned embodiments, since the inductor and the integrated components with capacitors are embedded in the redistribution structure, the inductor and the capacitor in the integrated components may be integrated into the semiconductor package, so the semiconductor package is compact in size. The integrated components with interconnect layers increase the communication bandwidth between the integrated circuit dies while maintaining low contact resistance and high reliability. Furthermore, since the inductor and the capacitors are integrated into the semiconductor package, a short electrical path is provided between the inductor and the capacitors. The inductor and the capacitors form an LC circuit in the semiconductor package to increase power efficiency of the semiconductor package. Moreover, the electrical path between the integrated circuit dies and the LC circuit may be shortened, thus further reduce the parasitic impedance and improve the efficiency of the LC circuit. The inductor is formed by the conductive lines in the redistribution structure, thereby the electrical resistance may be reduced and the inductance of the inductor is improved, and the inductor may provide larger current drawn for high power voltage regulator of the semiconductor package. The inductor may further include magnetic cores surrounded by the conductive lines of the inductor, thereby further improve the inductance and overall power efficiency of the package.

In accordance with some embodiments of the application, a structure includes a first via and a first conductive line embedded in a first dielectric layer and spaced apart from each other by the first dielectric layer; a first metal pattern disposed on the first via and embedded in a second dielectric layer; a first conductive via disposed on the first conductive line and embedded in the second dielectric layer, wherein the first metal pattern and the first conductive via are spaced apart from each other and are located on a first horizontal level, and the first metal pattern has an open ring shape; a second via disposed on the first metal pattern and embedded in a third dielectric layer; a second conductive line disposed on the second conductive via and embedded in the third dielectric layer; a second metal pattern disposed on the second via and embedded in a fourth dielectric layer; and a second conductive via disposed on the second conductive line and embedded in the fourth dielectric layer, wherein the second metal pattern and the second conductive via are spaced apart from each other and are located on a second horizontal level, the second metal pattern has an open ring shape, and the first metal pattern vertically partially overlaps the second metal pattern. Wherein the first via, the first metal pattern, the second via and the second metal pattern are electrically connected, and an inductor structure including the first via, the first metal pattern, the second via and the second metal pattern extends from the first dielectric layer to the fourth dielectric layer.

In accordance with alternative embodiments of the application, a method of fabricating a structure includes: forming a first dielectric layer; forming a first via and a first conductive line embedded in the first dielectric layer, the first via and the first conductive line are spaced apart from each other by the first dielectric layer; forming a second dielectric layer on the first dielectric layer; forming a first metal pattern and a first conductive via embedded in the second dielectric layer, the first metal pattern is disposed on the first via, the first conductive via is disposed on the first conductive line, wherein the first metal pattern and the first conductive via are spaced apart from each other and are located on a first horizontal level, and the first metal pattern has an open ring shape; forming a third dielectric layer on the second dielectric layer; forming a second via and a second conductive line embedded in the third dielectric layer, the second via is disposed on the first metal pattern, and the second conductive line is disposed on the second conductive via; forming a fourth dielectric layer on the third dielectric layer; forming a second metal pattern and a second conductive via embedded in the fourth dielectric layer, the second metal pattern is disposed on the second via, the second conductive via is disposed on the second conductive line, wherein the second metal pattern and the second conductive via are spaced apart from each other and are located on a second horizontal level, the second metal pattern has an open ring shape, and the first metal pattern vertically partially overlaps the second metal pattern, wherein the first via, the first metal pattern, the second via and the second metal pattern are electrically connected, and an inductor structure including the first via, the first metal pattern, the second via and the second metal pattern extends from the first dielectric layer to the fourth dielectric layer.

In accordance with yet alternative embodiments of the application, a semiconductor package includes an organic substrate; a multilayered structure disposed on the organic substrate, the multilayered structure comprising: lower redistribution layers, each of the lower redistribution layers comprising a dielectric layer, a conductive line, and a conductive via; an upper redistribution layer disposed on a first redistribution layer of the lower redistribution layers; and a molded layer disposed between the lower redistribution layers and the upper redistribution layer; an integrated component embedded in the molded layer, the integrated component comprising a capacitor; an inductor structure embedded in the lower redistribution layers, the inductor structure is electrically connected to the capacitor of the integrate component; and a first die and a second die disposed on the multilayered structure, the multilayered structure is disposed between the organic substrate and the first die or the second die, and the integrated component electrically connected the first die to the second die through the multilayered structure.

The foregoing outlines features of several embodiments so that those skilled in the art may better understand the aspects of the present application. Those skilled in the art should appreciate that they may readily use the present application as a basis for designing or modifying other processes and structures for carrying out the same purposes and/or achieving the same advantages of the embodiments introduced herein. Those skilled in the art should also realize that such equivalent constructions do not depart from the spirit and scope of the present application, and that they may make various changes, substitutions, and alterations herein without departing from the spirit and scope of the present application.

What is claimed is:

1. A structure, comprising:
a first via and a first conductive line embedded in a first dielectric layer and spaced apart from each other by the first dielectric layer;
a first metal pattern disposed on the first via and embedded in a second dielectric layer;
a first conductive via disposed on the first conductive line and embedded in the second dielectric layer, wherein the first metal pattern and the first conductive via are spaced apart from each other by the second dielectric layer, and the first metal pattern has a ring shape with two opposite terminals not joined;
a second via disposed on the first metal pattern and embedded in a third dielectric layer;
a second conductive line disposed on the second conductive via and embedded in the third dielectric layer;
a second metal pattern disposed on the second via and embedded in a fourth dielectric layer; and
a second conductive via disposed on the second conductive line and embedded in the fourth dielectric layer, wherein the second metal pattern and the second conductive via are spaced apart from each other by the fourth dielectric layer, the second metal pattern has a ring shape with two opposite terminals not joined, and the two opposite terminals of the first metal pattern do not vertically overlap the two opposite terminals of the second metal pattern, wherein the first via, the first metal pattern, the second via and the second metal pattern are electrically connected, and an inductor structure including the first via, the first metal pattern, the second via and the second metal pattern extends from the first dielectric layer to the fourth dielectric layer.

2. The structure of claim 1, wherein an orthographic projection of the first via does not overlap an orthographic projection of the second via.

3. The structure of claim 1, further comprising:
a third via disposed on the second metal pattern; and
a third metal pattern disposed on the third via, wherein the third metal pattern has an open ring shape, and the second metal pattern vertically partially overlaps the third metal pattern.

4. The structure of claim 3, wherein an orthographic projection of the second via does not overlap an orthographic projection of the third via.

5. The structure of claim 1, wherein a thickness of the first via is smaller than a thickness of the first metal pattern.

6. The structure of claim 1, wherein the first via is disposed near one of the two opposite terminals of the first metal pattern.

7. The structure of claim 1, wherein a width of the first metal pattern is about 1 time to about 10 times of a thickness of the first metal pattern.

8. The structure of claim 1, wherein the first metal pattern is vertically aligned with the second metal pattern, and a width of the first metal pattern is substantially the same as a width of the second metal pattern.

9. The structure of claim 1, further comprising a first magnetic core embedded in the second dielectric layer and surrounded by the first metal pattern.

10. The structure of claim 9, further comprising a second magnetic core embedded in the fourth dielectric layer and surrounded by the second metal pattern.

11. A fabrication method, comprising:
forming a first dielectric layer;
forming a first via and a first conductive line embedded in the first dielectric layer, the first via and the first conductive line are spaced apart from each other by the first dielectric layer;
forming a second dielectric layer on the first dielectric layer;
forming a first metal pattern and a first conductive via embedded in the second dielectric layer, the first metal pattern is disposed on the first via, the first conductive via is disposed on the first conductive line, wherein the first metal pattern and the first conductive via are spaced apart from each other by the second dielectric layer, and the first metal pattern has a ring shape with two opposite terminals not joined;

forming a third dielectric layer on the second dielectric layer;

forming a second via and a second conductive line embedded in the third dielectric layer, the second via is disposed on the first metal pattern, and the second conductive line is disposed on the second conductive via;

forming a fourth dielectric layer on the third dielectric layer;

forming a second metal pattern and a second conductive via embedded in the fourth dielectric layer, the second metal pattern is disposed on the second via, the second conductive via is disposed on the second conductive line, wherein the second metal pattern and the second conductive via are spaced apart from each other by the fourth dielectric layer, the second metal pattern has a ring shape with two opposite terminals not joined, and the two opposite terminals of the first metal pattern do not vertically overlap the two opposite terminals of the second metal pattern, wherein the first via, the first metal pattern, the second via and the second metal pattern are electrically connected, and an inductor structure including the first via, the first metal pattern, the second via and the second metal pattern extends from the first dielectric layer to the fourth dielectric layer.

12. The method of claim 11, wherein the first metal pattern and the second metal pattern are at different heights along a vertical direction.

13. The method of claim 11, wherein an orthographic projection of the first via does not overlap an orthographic projection of the second via.

14. The method of claim 11, wherein the second via is disposed near one of the two opposite terminals of the second metal pattern.

15. The method of claim 11, further comprising:
forming a first magnetic core embedded in the second dielectric layer and surrounded by the first metal pattern; and
forming a second magnetic core embedded in the fourth dielectric layer and surrounded by the second metal pattern.

16. The method of claim 15, wherein a permeability ($\mu$) of the first magnetic core is substantially 10 times to 100 times the vacuum permeability ($\mu 0$).

* * * * *